United States Patent
Inoue et al.

(10) Patent No.: US 9,209,203 B2
(45) Date of Patent: Dec. 8, 2015

(54) ACTIVE MATRIX SUBSTRATE AND METHOD FOR MANUFACTURING THE SAME

(71) Applicant: Mitsubishi Electric Corporation, Tokyo (JP)

(72) Inventors: Kazunori Inoue, Kumamoto (JP); Nobuaki Ishiga, Kumamoto (JP); Kensuke Nagayama, Kumamoto (JP); Naoki Tsumura, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/559,171

(22) Filed: Dec. 3, 2014

(65) Prior Publication Data

US 2015/0162358 A1 Jun. 11, 2015

(30) Foreign Application Priority Data

Dec. 11, 2013 (JP) .................................. 2013-255904

(51) Int. Cl.
*H01L 27/12* (2006.01)

(52) U.S. Cl.
CPC .......... *H01L 27/1225* (2013.01); *H01L 27/124* (2013.01); *H01L 27/127* (2013.01); *H01L 27/1262* (2013.01)

(58) Field of Classification Search
CPC . H01L 27/124; H01L 27/127; H01L 27/1225; H01L 27/1262
See application file for complete search history.

(56) References Cited

U.S. PATENT DOCUMENTS

| 4,918,504 | A | 4/1990 | Kato et al. |
|---|---|---|---|
| 5,198,377 | A | 3/1993 | Kato et al. |
| 6,449,026 | B1 | 9/2002 | Min et al. |
| 6,468,840 | B2 | 10/2002 | Tanaka et al. |
| 6,485,997 | B2 | 11/2002 | Lee et al. |
| 6,800,872 | B2 | 10/2004 | Tanaka et al. |
| 7,061,014 | B2 | 6/2006 | Hosono et al. |

(Continued)

FOREIGN PATENT DOCUMENTS

| JP | S64-035529 A | 2/1989 |
|---|---|---|
| JP | 2001-056474 A | 2/2001 |

(Continued)

OTHER PUBLICATIONS

Kenji Nomura et al.; "Room-temperature fabrication of transparent flexible thin-film transistors using amorphous oxide semiconductors"; Nature; vol. 432 (2004); p. 488-492.

*Primary Examiner* — Tan N Tran
*Assistant Examiner* — Fazli Erdem
(74) *Attorney, Agent, or Firm* — Studebaker & Brackett PC

(57) ABSTRACT

A thin film transistor includes: a semiconductor channel film; a gate insulating film on the semiconductor channel film; a gate electrode formed of a laminated film including a first conductive film and a second conductive film on the gate insulating film; an interlayer insulating film covering the semiconductor channel film, the gate insulating film, and the gate electrode; a source electrode formed of a laminated film including a third conductive film and a fourth conductive film formed on the interlayer insulating film; and a drain electrode formed of the third conductive film. A gate wiring is formed of the laminated film including the first conductive film and the second conductive film. A source wiring is formed of the laminated film including the third conductive film and the fourth conductive film. A pixel electrode is formed of the first conductive film. A counter electrode is formed of the third conductive film.

17 Claims, 41 Drawing Sheets

(56) References Cited

U.S. PATENT DOCUMENTS

| | | |
|---|---|---|
| 8,045,078 B2 | 10/2011 | Lim et al. |
| 8,268,654 B2 | 9/2012 | Fujikawa et al. |
| 8,895,333 B2 | 11/2014 | Fujikawa et al. |
| 2007/0090365 A1 | 4/2007 | Hayashi et al. |
| 2009/0108264 A1* | 4/2009 | Inoue et al. ............ 257/59 |
| 2010/0187532 A1* | 7/2010 | Nagano et al. ............ 257/59 |
| 2015/0028340 A1* | 1/2015 | Iwasaka et al. ............ 257/72 |
| 2015/0162351 A1* | 6/2015 | Hiwatashi et al. .... H01L 27/124 |

FOREIGN PATENT DOCUMENTS

| | | |
|---|---|---|
| JP | 2001-235763 A | 8/2001 |
| JP | 2001-311965 A | 11/2001 |
| JP | 2004-103957 A | 4/2004 |
| JP | 2005-077822 A | 3/2005 |
| JP | 2007-115902 A | 5/2007 |
| JP | 2008-072011 A | 3/2008 |
| JP | 2009-025788 A | 2/2009 |
| JP | 2009-157366 A | 7/2009 |

* cited by examiner

F I G . 1 1
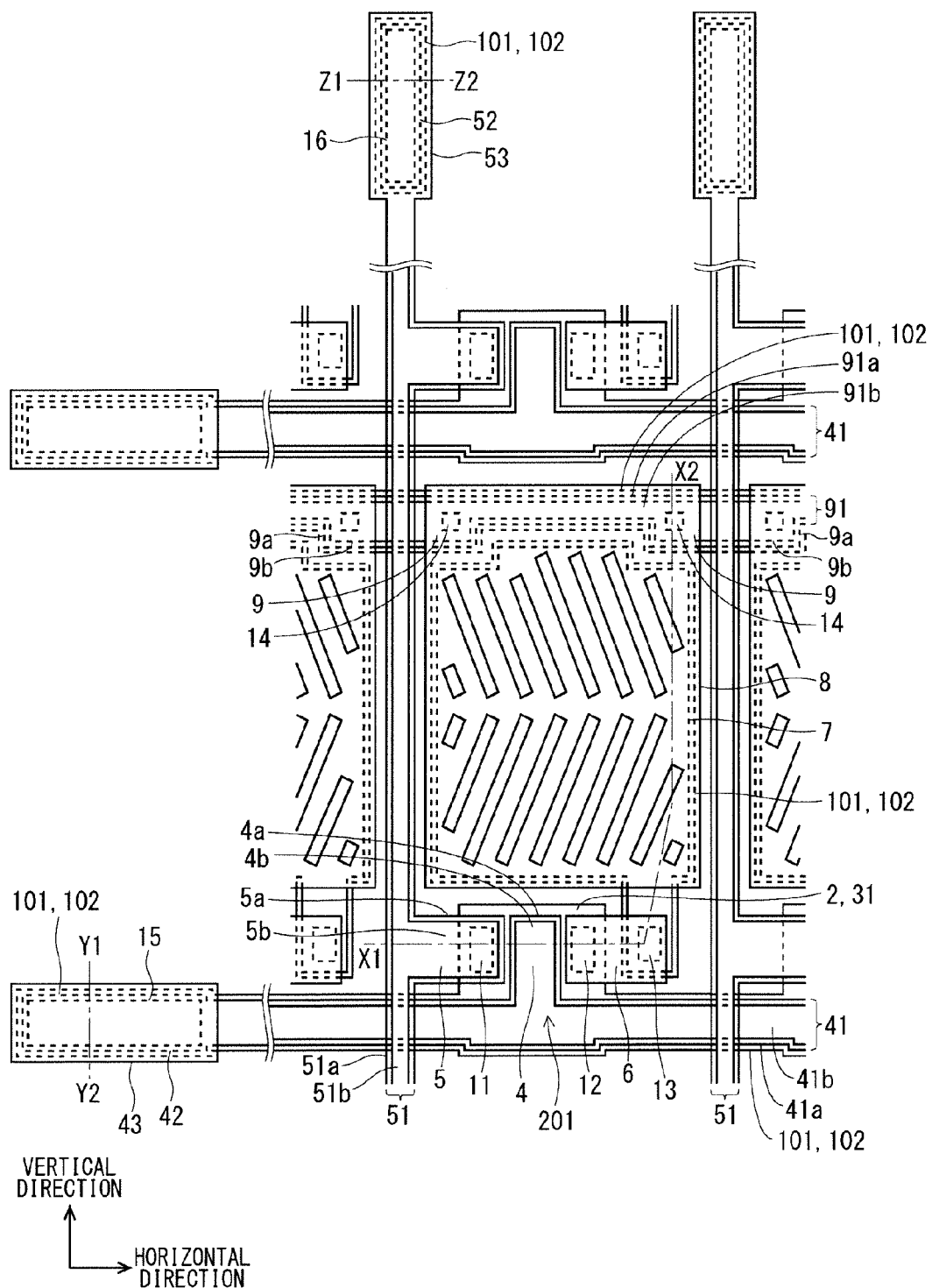

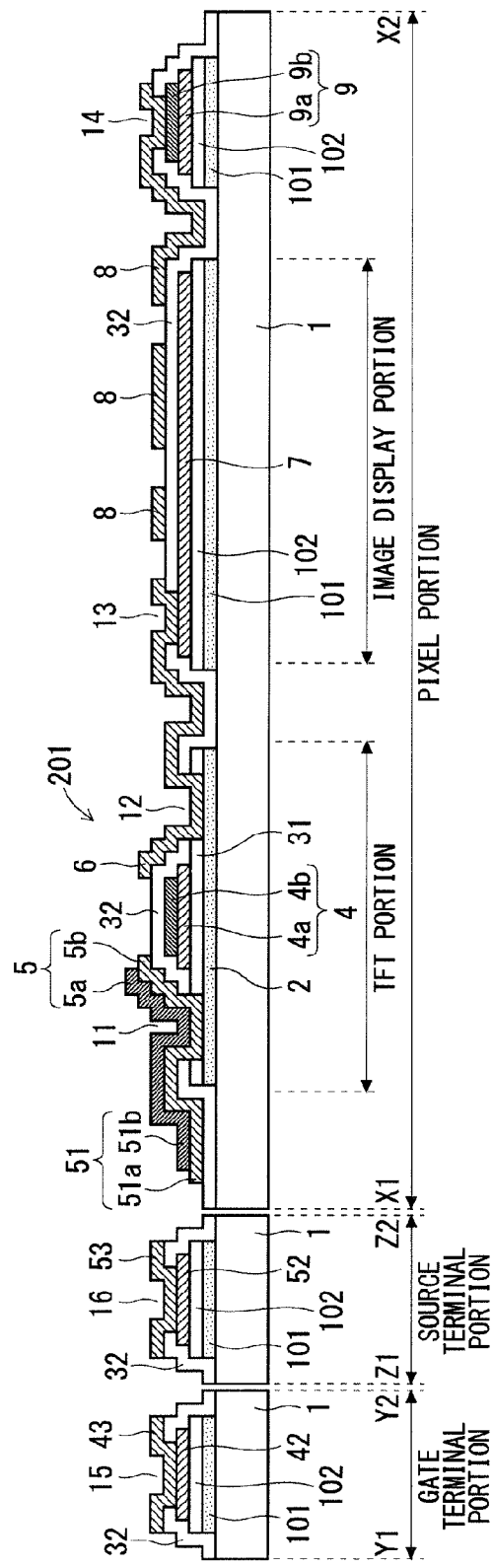

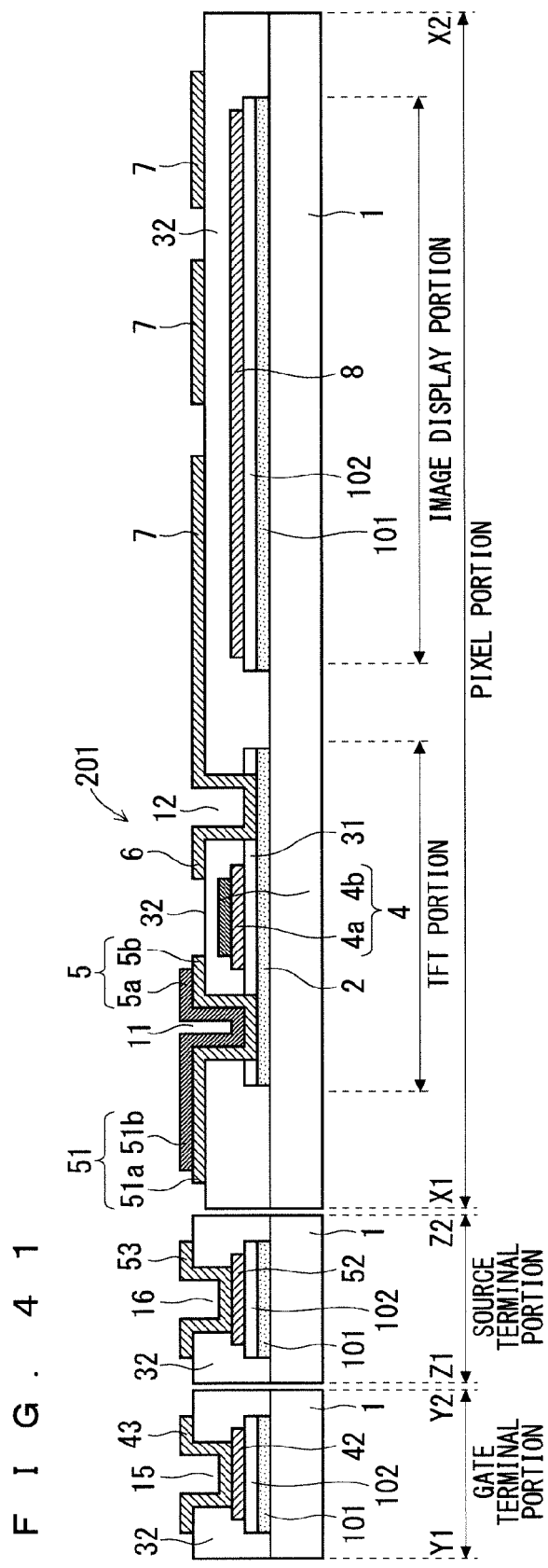

ACTIVE MATRIX SUBSTRATE AND METHOD FOR MANUFACTURING THE SAME

BACKGROUND OF THE INVENTION

1. Field of the Invention

The present invention relates to an active matrix substrate used in a display or the like and to a method for manufacturing the active matrix substrate.

2. Description of the Background Art

An active matrix substrate (hereinafter referred to as a "TFT substrate") that includes a thin film transistor (TFT) serving as a switching element is widely known to be used in an electro-optical device such as a liquid crystal display (LCD). The LCD including the TFT substrate (TFT-LCD) requires improvements on display characteristics (such as a wide viewing angle, high definition, and high quality) and also requires low costs as a result of simplifying manufacturing steps for an efficient manufacturing.

The general TFT-LCD has a liquid crystal cell as the basic structure in which the TFT substrate (element substrate) and a counter substrate (CF substrate) sandwich a liquid crystal layer, and the TFT-LCD is formed of the liquid crystal cell including a polarizer bonded thereto. The TFT substrate includes a plurality of pixels in which a pixel electrode and a TFT that is connected to the pixel electrode are disposed in a matrix pattern. The counter substrate includes a color filter (CF) and a counter electrode disposed opposite to the pixel electrode. For example, a full transmissive LCD includes a backlight (BL) on a back surface side of the liquid crystal cell.

In this manner, the liquid crystal cell including the pixel electrode and the counter electrode for generating an electric field to drive the liquid crystals disposed so as to sandwich the liquid crystal layer is a liquid crystal cell of a vertical electric field driving method typified by a twisted nematic (TN) mode. The TFT substrate of the TN mode is normally manufactured in four or five photolithography steps (photolithography processes). For example, Japanese Patent Application Laid-Open No. 64-35529 (1989), Japanese Patent Application Laid-Open No. 2001-311965, and Japanese Patent Application Laid-Open No. 2009-25788 below disclose a manufacturing method for forming the TFT substrate in three photolithography steps.

On the other hand, in terms of the wide viewing angle of the TFT-LCD, an in-plane switching (IPS) mode ("IPS" is a trademark) has been developed, the IPS mode being one of lateral electric field driving methods including both of the pixel electrode and the counter electrode disposed on the TFT substrate. The IPS mode can obtain the viewing angle wider than that of the vertical electric field driving method, but an image display portion has an aperture ratio and a transmittance lower than those of the vertical electric field driving method, so that it is difficult to obtain bright display characteristics. This problem arises in the situation where an electric field for driving liquid crystals fails to operate effectively on liquid crystals in a region directly above the pixel electrode having a comb pattern. A fringe field switching (FFS) mode has been developed as a lateral electric field driving method capable of improving this problem (for example, Japanese Patent Application Laid-Open No. 2001-56474).

Moreover, in terms of high definition and high quality of the TET-LCD, a technology has been developed to use an oxide semiconductor having a mobility higher than that of the conventional Si for a semiconductor serving as an active layer of the TFT formed in the TFT substrate (for example, Japanese Patent Application Laid-Open No. 2004-103957, Japanese Patent Application Laid-Open No. 2005-77822, Japanese Patent Application Laid-Open No. 2008-72011 and Nature Vol. 432 (2004) p. 488). Examples of the oxide semiconductor include a zinc oxide (ZnO) system and an InGaZnO system in which a gallium oxide ($Ga_2O_3$) and an indium oxide ($In_2O_3$) are added to the zinc oxide (ZnO). The oxide semiconductor film has light-transmissive properties higher than those of a Si semiconductor film, and Japanese Patent Application Laid-Open No. 2007-115902, for example, discloses that an oxide semiconductor film having a transmittance of greater than or equal to 70% to visible light of 400 nm to 800 nm.

The oxide semiconductor film above can be etched with a weak acid solution such as oxalic acid and carboxylic acid, and thus there is an advantage that a pattern is easily processed. However, the oxide semiconductor film is easily dissolved by an acid solution normally used in an etching process on general metal films (Cr, Ti, Mo, Ta, Al, Cu, and alloys thereof) that are used for a source electrode and a drain electrode of the TFT. Thus, when the metal films to be the source electrode and the drain electrode are etched (patterned), it is necessary to consider preventing the oxide semiconductor film from being destroyed. For example, Japanese Patent Application Laid-Open No. 2005-77822 discloses a technology to add a new element to the oxide semiconductor to improve resistance to a chemical solution and a technology to optimize film thicknesses of the metal film and the oxide semiconductor film to be the source electrode and the drain electrode.

The LCD of the FFS mode has excellent viewing angle characteristics and panel transmittance, whereby demand is on the increase. However, the TFT substrate used for the LCD of the FFS mode requires both of the pixel electrode and the counter electrode (common electrode) to be formed on the TFT substrate, thereby increasing the number of wire layers of the TFT substrate. This increases the number of photolithography steps required for forming the TFT substrate, which causes an increase in manufacturing costs.

For example, the TFT substrate of the general FFS-LCD disclosed in FIGS. 1 and 3 of Japanese Patent Application Laid-Open No. 2001-56474 is manufactured in six photolithography steps. As described above, the manufacturing method that requires the three photolithography steps for the TFT substrate of the conventional TN mode has been developed, and thus reducing the number of photolithography steps is a major challenge in manufacturing the TFT substrate of the FFS mode.

To solve the problem, Japanese Patent Application Laid-Open No. 2001-235763 and Japanese Patent Application Laid-Open No. 2009-157366 disclose a method to reduce the photolithography steps to four or five times in manufacturing the TFT substrate of the FFS mode. However, the number of photolithography steps is still great compared to the manufacture of the TFT substrate of the TN mode, whereby an increase in the manufacturing costs is inevitable.

Furthermore, as described above, the general oxide semiconductor film is easily dissolved by the acid solution used for etching the metal films (Cr, Ti, Mo, Ta, Al, Cu, and alloys thereof) that are used for the source electrode and the drain electrode of the TFT. The general oxide semiconductor is difficult to be used in a case of the structure exposing a lower layer of the semiconductor film upon the etching process on the source electrode and the drain electrode, as with the structure of the TFT in Japanese Patent Application Laid-Open No. 2001-56474 (FIGS. 1 and 3), Japanese Patent Application Laid-Open No. 2001-235763 (FIG. 3), and Japanese Patent Application Laid-Open No. 2009-157366 (FIG. 5).

SUMMARY OF THE INVENTION

It is an object of the present invention to provide an active matrix substrate of an FFS mode capable of easily using an oxide semiconductor film as a semiconductor channel film of a TFT and suppressing the number of photolithography steps during manufacturing.

An active matrix substrate of the present invention includes: a substrate; a thin film transistor formed on the substrate; a gate wire connected to a gate electrode of the thin film transistor; a source wire connected to a source electrode of the thin film transistor; a pixel electrode connected to a drain electrode of the thin film transistor; a counter electrode disposed opposite to the pixel electrode; and a common wire supplying the counter electrode with a specified voltage.

The thin film transistor includes: a semiconductor channel film that is formed on the substrate and is formed of a semiconductor film; and a gate insulating film that is formed on the semiconductor channel film and is formed of a first insulating film. The gate electrode of the thin film transistor is formed of a laminated film including a first conductive film and a second conductive film on the first conductive film formed on the gate insulating film. An interlayer insulating film is formed on the semiconductor channel film, the gate insulating film, and the gate electrode and is formed of a second insulating film. The source electrode of the thin film transistor is formed of a laminated film including a third conductive film and a fourth conductive film on the third conductive film formed on the interlayer insulating film and is connected to the semiconductor channel film through a contact hole formed in the interlayer insulating film and the gate insulating film. The drain electrode of the thin film transistor is formed of the third conductive film and is connected to the semiconductor channel film through a contact hole formed in the interlayer insulating film and the gate insulating film.

The gate wire is formed of the laminated film including the first conductive film and the second conductive film and is formed to be connected to the gate electrode. The source wire is formed of the laminated film including the third conductive film and the fourth conductive film and is formed to be connected to the source electrode. The pixel electrode is formed of the first conductive film and is connected to the drain electrode through a contact hole formed in the interlayer insulating film. The counter electrode is formed of the third conductive film and formed on the pixel electrode via the interlayer insulating film.

The present invention can suppress the number of photolithography steps in manufacturing the active matrix substrate of the FFS mode including the TFT, allowing for an improvement in productivity, which results in a reduction in manufacturing costs. Furthermore, the oxide semiconductor having a high mobility can be used for the semiconductor channel film of the TFT, which can also contribute to high definition and high performance of the active matrix substrate.

BRIEF DESCRIPTION OF THE DRAWINGS

FIG. 11 is a plan view showing a TFT substrate according to the second preferred embodiment;

FIG. 12 is a cross-sectional view showing the TFT substrate according to the second preferred embodiment;

FIG. 41 is a cross-sectional view of a TFT substrate according to a modification in which a planarizing film is applied to an interlayer insulating film of the TFT substrate according to the fourth preferred embodiment.

DESCRIPTION OF THE PREFERRED EMBODIMENTS

First Preferred Embodiment

Figure 1:
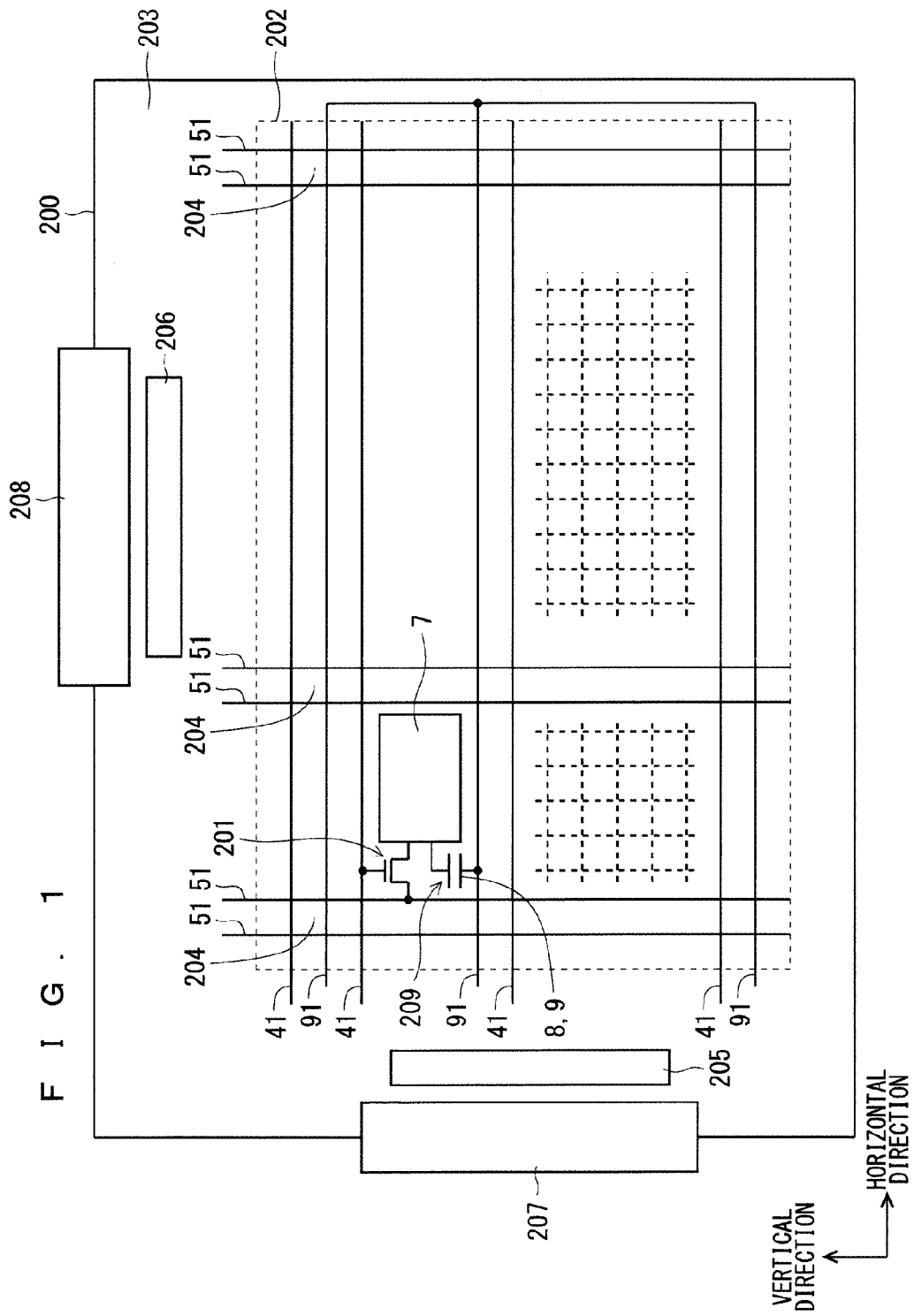
FIG. 1 is a plan view showing a configuration of a TFT substrate according to first, second and fourth preferred embodiments.

FIG. 1 is a plan view showing a configuration of a TFT substrate according to a first preferred embodiment. The TFT substrate of the first preferred embodiment is an active matrix substrate including a plurality of TFTs serving as switching elements disposed in a matrix pattern. An example of the TFT substrate for a full transmissive LCD is given for a description here.

A TFT substrate 200 can be divided into a display region 202 in which a plurality of pixels 204 including a TFT 201 and a pixel electrode 7 are disposed in a matrix pattern and a frame region 203 surrounding the display region 202.

The display region 202 includes a plurality of gate wires 41 (scanning signal lines) and a plurality of source wires 51 (display signal lines) disposed therein. The plurality of gate wires 41 are disposed in parallel to each other, and the plurality of source wires 51 are also disposed in parallel to each other. The plurality of gate wires 41 and the plurality of source wires 51 intersect each other. In FIG. 1, the gate wires 41 extend in a horizontal direction, and the source wires 51 extend in a vertical direction. Regions surrounded by the adjacent gate wires 41 and the adjacent source wires 51 are the pixels 204, so that the pixels 204 are disposed in the matrix pattern in the display region 202

FIG. 1 shows the one representative pixel 204 that is enlarged. The pixel 204 includes at least one of the TFTs 201 disposed therein. The TFT 201 is disposed near the intersection of the gate wire 41 and the source wire 51. The TFT 201 includes a gate electrode connected to the gate wire 41, a source electrode connected to the source wire 51, and a drain electrode connected to the pixel electrode 7.

Meanwhile, the frame region 203 of the TFT substrate 200 includes a scanning signal driving circuit 205 and a display signal driving circuit 206 provided therein. The gate wires 41 are drawn from the display region 202 to the frame region 203 on the side where the scanning signal driving circuit 205 is provided, to thereby be connected to the scanning signal driving circuit 205, which is omitted from the diagram. Similarly, the source wires 51 are drawn from the display region 202 to the frame region 203 on the side where the display signal driving circuit 206 is provided, to thereby be connected to the display signal driving circuit 206.

An external wire 207 for connecting the scanning signal driving circuit 205 to the outside is disposed near the scanning signal driving circuit 205. An external wire 208 for connecting the display signal driving circuit 206 to the outside is disposed near the display signal driving circuit 206. The external wire 207 and the external wire 208 are wire substrates such as a flexible printed circuit (FPC).

The scanning signal driving circuit 205 is supplied with various control signals from the outside through the external wire 207. The display signal driving circuit 206 is supplied with various control signals and image data from the outside through the external wire 208. The scanning signal driving circuit 205 supplies the gate wires 41 with a gate signal (scanning signal) based on the control signal from the outside. The gate wires 41 are selected in turn at regular intervals by the control signal. The display signal driving circuit 206 supplies the source wires 51 with a display signal in response to the image data based on the control signal from the outside. The operations of the scanning signal driving circuit 205 and the display signal driving circuit 206 supply each pixel 204 with a display voltage in response to the display signal.

In addition, it is not restrictive that the scanning signal driving circuit 205 and the display signal driving circuit 206 are formed on the TFT substrate 200. The scanning signal driving circuit 205 and the display signal driving circuit 206 may be configured to include a tape carrier package (TCP) and be connected to the TFT substrate 200.

The TFT 201 functions as a switching element for supplying the pixel electrode 7 with the display voltage, and the gate signal supplied to the gate electrode from the gate wire 41 controls the TFT 201 to turn on and off. Upon the TFT 201 turning on, the display voltage supplied to the source wire 51 is applied to the pixel electrode 7 through the TFT 201. The pixel 204 includes a common electrode 9 that is supplied with a specified voltage (common voltage) through a common wire 91 and a counter electrode 8 that is connected to the common electrode 9 and is disposed opposite to the pixel electrode 7, and an electric field in response to the display voltage is generated between the pixel electrode 7 and the counter electrode 8 (the counter electrode 8 and the common electrode 9 are at the same potential, so that the counter electrode 8 is omitted from FIG. 1). A holding capacitor 209 formed between the pixel electrode 7 and the common electrode 9 holds the display voltage applied to the pixel electrode 7 for a fixed time during displaying an image of one frame. In this preferred embodiment, the common wires 91 are disposed to extend in parallel to the gate wires 41.

In a case of a liquid crystal display (LCD), a counter substrate (not shown) is disposed so as to be opposite to the TFT substrate 200. The counter substrate is, for example, a color filter (CF) substrate and is disposed on the front surface side (visible side). A color filter, a black matrix (BM), an alignment film, or the like is formed on the counter substrate. The alignment film may be formed on a surface of the TFT substrate 200. In a case of the LCD of a lateral electric field drive mode such as an FFS mode, the common electrode 9 is disposed on the TFT substrate 200 instead of the counter substrate.

The TFT substrate 200 and the counter substrate are bonded with a certain gap (cell gap) therebetween, and liquid crystals are injected into the gap and sealed, thereby forming a liquid crystal display panel. In other words, the liquid crystal display panel has a structure sandwiching the liquid crystal layer between the TFT substrate 200 and the counter substrate. Moreover, a polarizing plate, a phase difference plate, or the like is provided on an outer surface of the liquid crystal display panel. The LCD includes a backlight (BL) unit or the like disposed on a back surface side of the liquid crystal display panel (on a back side of the TFT substrate 200).

A simple description is given here of an operation of the LCD. The liquid crystals sandwiched between the TFT substrate 200 and the counter substrate are driven by the electric field generated between the pixel electrode 7 and the counter electrode 8 (alignment directions of the liquid crystals are controlled). When the alignment directions of the liquid crystals are changed, a polarization state of light passing through the liquid crystals is changed. Specifically, the polarizing plate on the TFT substrate 200 side causes the light from the backlight unit disposed on the back surface side of the liquid crystal display panel to be a linearly polarized light. Then, the linearly polarized light is passed through the liquid crystal layer, thereby changing the polarization state.

After the light is passed through the liquid crystal layer, the polarization state changes the amount of light passing through the polarizing plate on the counter substrate side. In other words, of the transmitted light that is transmitted through the liquid crystal display panel from the backlight unit, the amount of light passing through the polarizing plate on the visible side is changed. The alignment directions of the liquid crystals are changed by the display voltage applied to the pixel electrode 7. Therefore, the control of the display voltage controls the amount of light passing through the polarizing plate on the visible side. In the liquid crystal display, the display voltage applied to each pixel is controlled based on the display data, to thereby display a desirable image.

Figure 2:
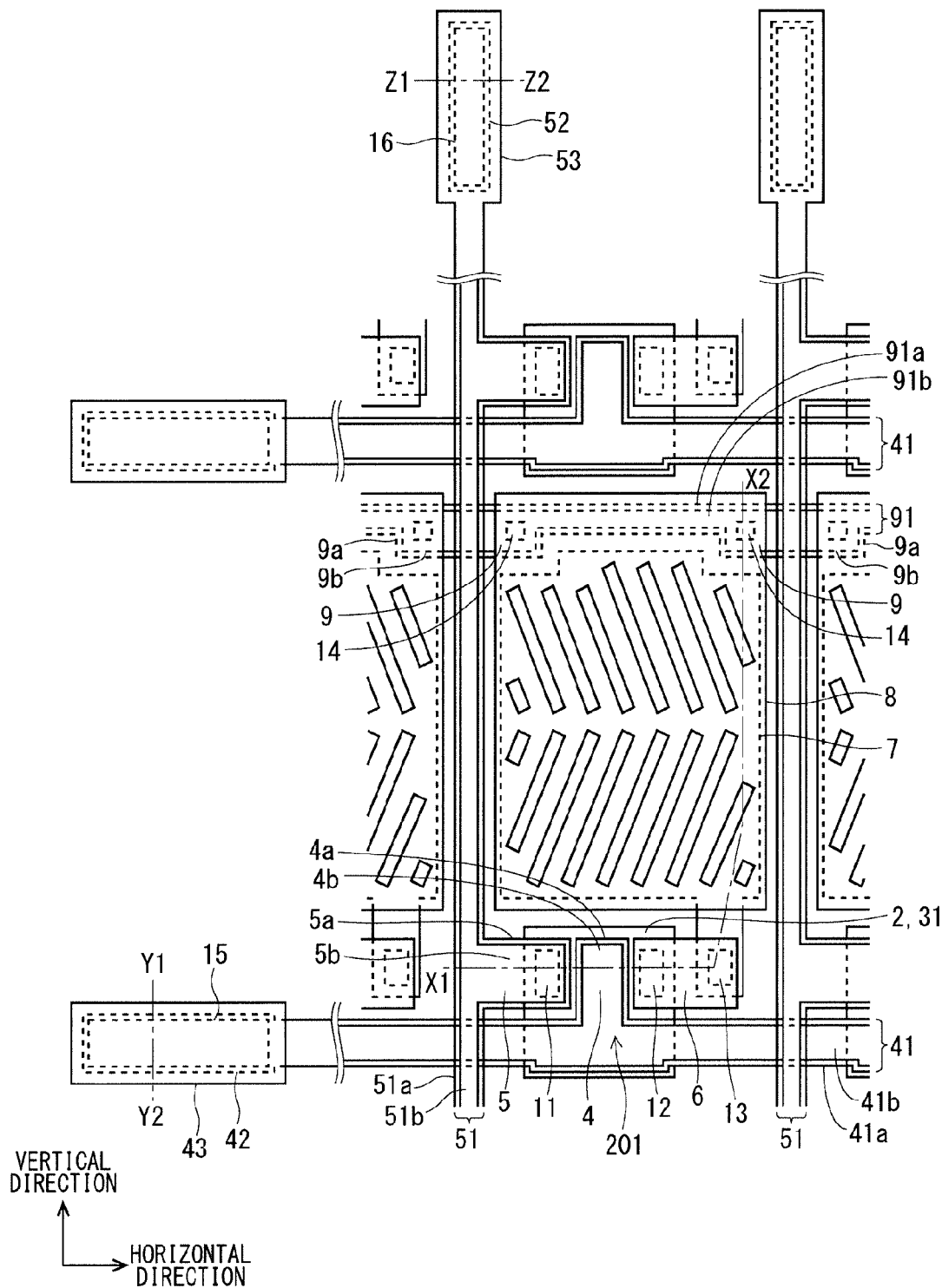
FIG. 2 is a plan view of the TFT substrate according to the first preferred embodiment.
Figure 3:
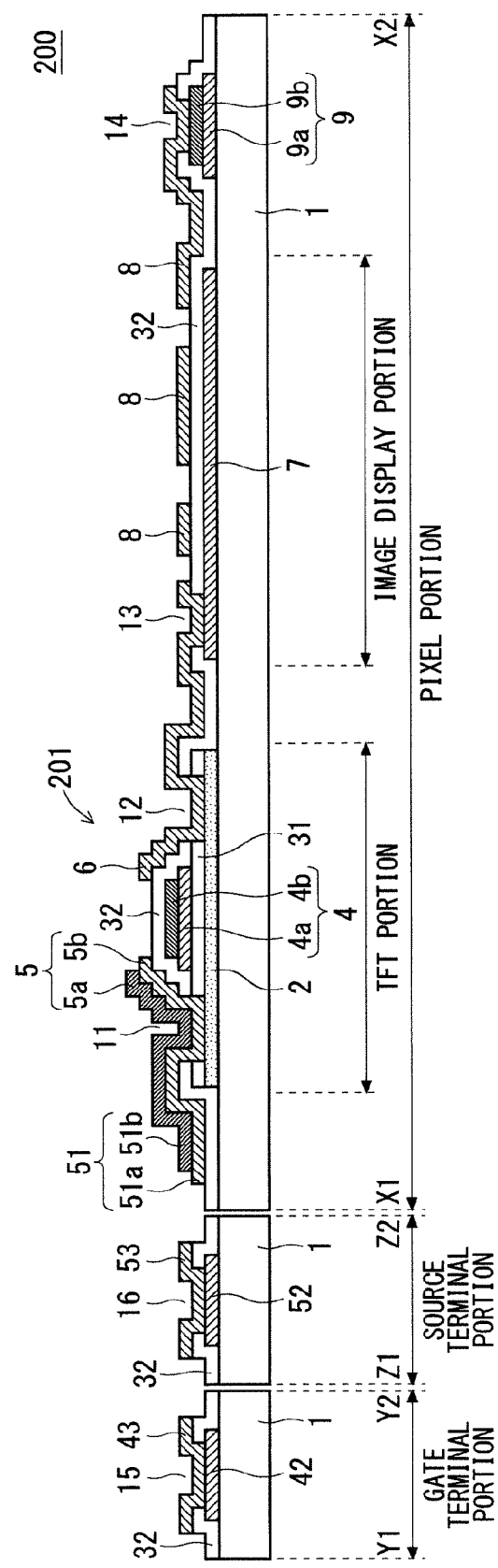
FIG. 3 is a cross-sectional view of the TFT substrate according to the first preferred embodiment.

Next, with reference to FIGS. 2 and 3, a more detailed configuration of the TFT substrate 200 according to the first preferred embodiment will be described. FIG. 2 is a diagram showing a planar configuration of a main part including the pixel 204 in the TFT substrate 200 of the FFS mode, and FIG. 3 is a cross-sectional configuration thereof. FIG. 3 shows corresponding cross sections taken along an X1-X2 line, a Y1-Y2 line, and a Z1-Z2 line shown in FIG. 2.

The cross section taken along the X1-X2 line corresponds to a region (pixel portion) for forming the pixel 204. The cross section of the pixel portion shown in FIG. 3 includes a "TFT portion" that is a region for forming the TFT 201 and an "image display portion" that is a region for forming the pixel electrode 7 and the counter electrode 8.

The cross section taken along the Y1-Y2 line corresponds to a region (gate terminal portion) for forming a gate terminal 42 that supplies the gate wires 41 with the gate signal and a gate terminal pad 43 that is provided on the gate terminal 42. The cross section taken along the Z1-Z2 line corresponds to a region (source terminal portion) for forming a source terminal 52 that applies the display signal to the source wires 51 and a source terminal pad 53 that is provided on the source terminal 52. The gate terminal 42 and the gate terminal pad 43 are provided at an end portion of the gate wire 41, and the source terminal 52 and the source terminal pad 53 are provided at an end portion of the source wire 51.

The TFT substrate 200 is formed to include a substrate 1 that is a transparent insulating substrate made of glass, for example. A light-transmissive semiconductor film 2 that forms an active layer (channel layer) of the TFT 201 (hereinafter, the semiconductor film in the TFT portion is referred to as a "semiconductor channel film") and a gate insulating film 31 that is formed on the semiconductor channel film 2 and is formed of a first insulating film are disposed on the substrate 1 of the TFT portion In the pixel portion. Moreover, a gate electrode 4 is formed on the gate insulating film 31. The gate electrode 4 has a laminated structure including a gate electrode lower layer portion 4a formed of a first conductive film and a gate electrode upper layer portion 4b formed of a second conductive film.

Similarly to the gate electrode 4, the gate wire 41 also has a laminated structure including a gate wire lower layer portion 41a formed of the first conductive film and a gate wire upper layer portion 41b formed of the second conductive film, which is not shown in FIG. 3. The gate wires 41 are formed on the substrate 1 so as to extend in the horizontal direction of FIG. 2. The gate electrode 4 is connected to the gate wires 41 (integrally formed with the gate wires 41). In other words, part of the gate wires 41 functions as the gate electrode 4, and the portion that branches off from the gate wires 41 and extends to the TFT portion forms the gate electrode 4 in the example of FIG. 2.

The pixel electrode 7 is formed on the substrate 1 of the image display portion. In the first preferred embodiment, the pixel electrode 7 is a flat plate-shaped electrode formed of the first conductive film and is individually formed in each pixel 204.

Furthermore, the common electrode 9 is formed on the substrate 1 in the pixel portion. The common electrode 9 has a laminated structure including a common electrode lower layer portion 9a formed of the first conductive film and a common electrode upper layer portion 9b formed of the second conductive film.

Similarly to the common electrode 9, the common wire 91 also has a laminated structure including a common wire lower layer portion 91a formed of the first conductive film and a common wire upper layer portion 91b formed of the second conductive film, which is not shown in FIG. 3. In the first preferred embodiment, the common wires 91 are formed on the substrate 1 so as to extend in parallel to the gate wires 41. The common electrode 9 is connected to the common wires 91 (integrally formed with the common wires 91). In other words, part of the common wires 91 functions as the common electrode 9, and the wide portion of the common wires 91 that overlaps the counter electrode 8 forms the common electrode 9 in the example of FIG. 2.

Meanwhile, the gate terminal 42 formed of the first conductive film is formed on the substrate 1 in the gate terminal portion. Moreover, the source terminal 52 formed of the first conductive film is formed on the substrate 1 in the source terminal portion.

An interlayer insulating film 32 (not shown in FIG. 2) formed of the second insulating film is formed entirely on the substrate 1 so as to cover the gate electrode 4, the gate wires 41, the pixel electrode 7, the common electrode 9, the common wires 91, the gate terminal 42, and the source terminal 52. Contact holes 11 to 16 are formed in the interlayer insulating film 32.

The contact hole 11 (source region contact hole) penetrates the interlayer insulating film 32 and the gate insulating film 31 to reach a portion of the semiconductor channel film 2, the portion being a source region of the TFT 201. The contact hole 12 (drain region contact hole) penetrates the interlayer insulating film 32 and the gate insulating film 31 to reach a portion of the semiconductor channel film 2, the portion being a drain region of the TFT 201. In other words, the contact hole 11 and the contact hole 12 are formed at the positions that sandwich the gate electrode 4. The contact hole 13 (pixel electrode contact hole) penetrates the interlayer insulating film 32 to reach the pixel electrode 7. The contact hole 14 (common electrode contact hole) penetrates the interlayer insulating film 32 to reach the common electrode 9. The contact hole 15 (gate terminal contact hole) penetrates the interlayer insulating film 32 to reach the gate terminal 42. The contact hole 16 (source terminal contact hole) penetrates the interlayer insulating film 32 to reach the source terminal 52.

A source electrode 5 and a drain electrode 6 of the TFT 201 are formed on the interlayer insulating film 32 of the TFT portion in the pixel portion. The source electrode 5 has a laminated structure including a source electrode lower layer portion 5a formed of a third conductive film and a source electrode upper layer portion 5b formed of a fourth conductive film. The source electrode 5 is connected to the semiconductor channel film 2 through the contact hole 11. The drain electrode 6 has a single-layer structure including the third conductive film. The drain electrode 6 is connected to the semiconductor channel film 2 through the contact hole 12 and is also connected to the pixel electrode 7 through the contact hole 13.

Moreover, similarly to the source electrode 5, the source wire 51 has a laminated structure including a source wire lower layer portion 51a formed of the third conductive film and a source wire upper layer portion 51b formed of the fourth conductive film. The source wires 51 are formed on the interlayer insulating film 32 so as to extend in the vertical direction, and the source electrode 5 is connected to the source wires 51 (integrally formed with the source wires 51). In other words, part of the source wires 51 functions as the source electrode 5, and the portion that branches off from the source wires 51 and extends to the TFT portion forms the source electrode 5 in the example of FIG. 2.

The counter electrode 8 formed of the third conductive film is disposed on the interlayer insulating film 32 of the image display portion so as to be opposite to the pixel electrode 7. In the first preferred embodiment, the counter electrode 8 is an electrode having a comb pattern or a grid pattern having slits, and the counter electrode 8 is connected to the common electrode 9 through the contact hole 14.

Meanwhile, the gate terminal pad 43 formed of the third conductive film is formed on the interlayer insulating film 32 in the gate terminal portion. Moreover, the source terminal pad 53 formed of the third conductive film is formed on the interlayer insulating film 32 in the source terminal portion. The gate terminal pad 43 is connected to the gate terminal 42 through the contact hole 15, and the source terminal pad 53 is connected to the source terminal 52 through the contact hole 16. The gate terminal pad 43 is supplied with the scanning signal from the scanning signal driving circuit 205 shown in FIG. 1, and the source terminal pad 53 is supplied with the display signal from the display signal driving circuit 206 shown in FIG. 1.

Figure 4:
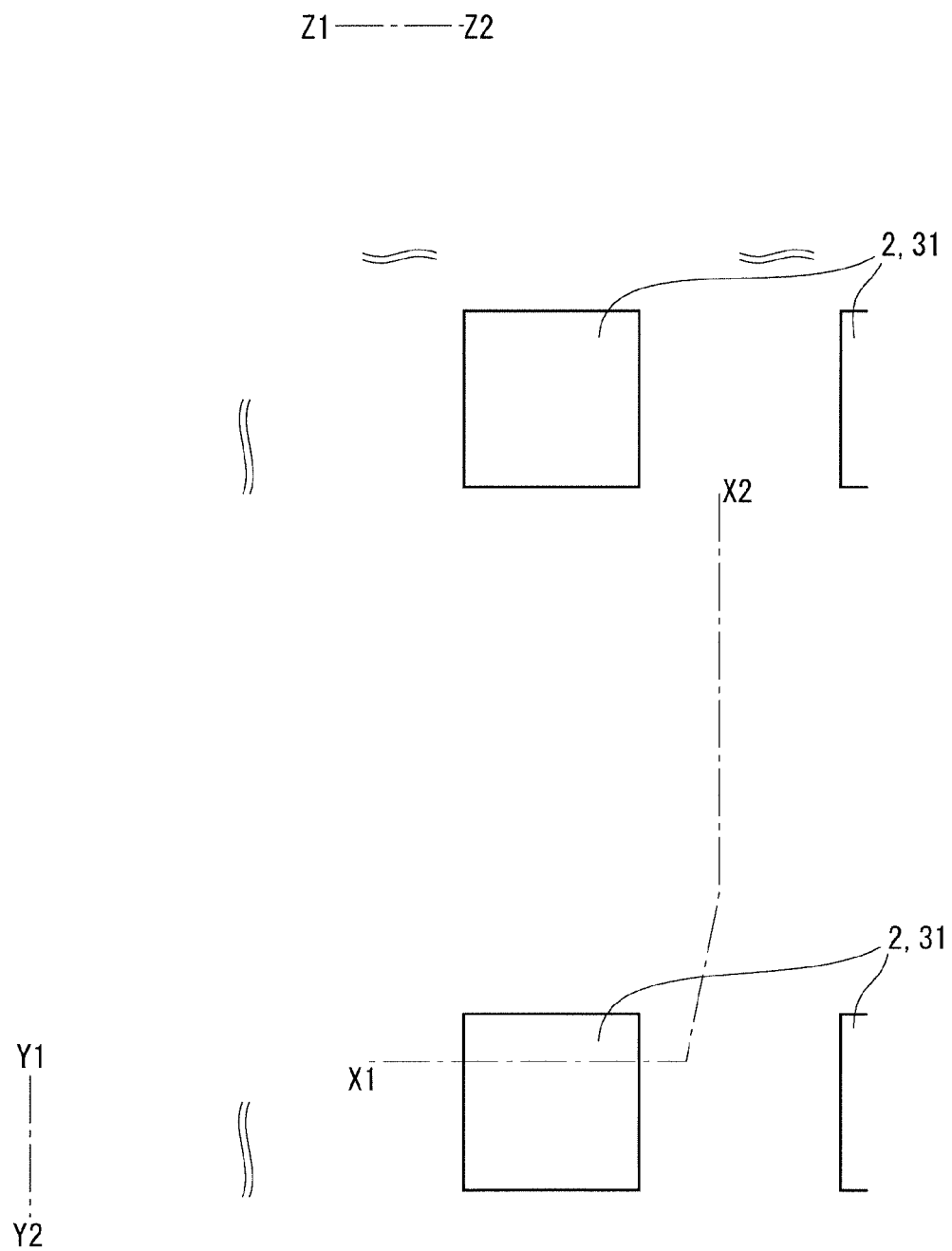
FIGS. 4 to 6 are process diagrams in plan view showing a method for manufacturing the TFT substrate according to the first preferred embodiment.
Figure 5:
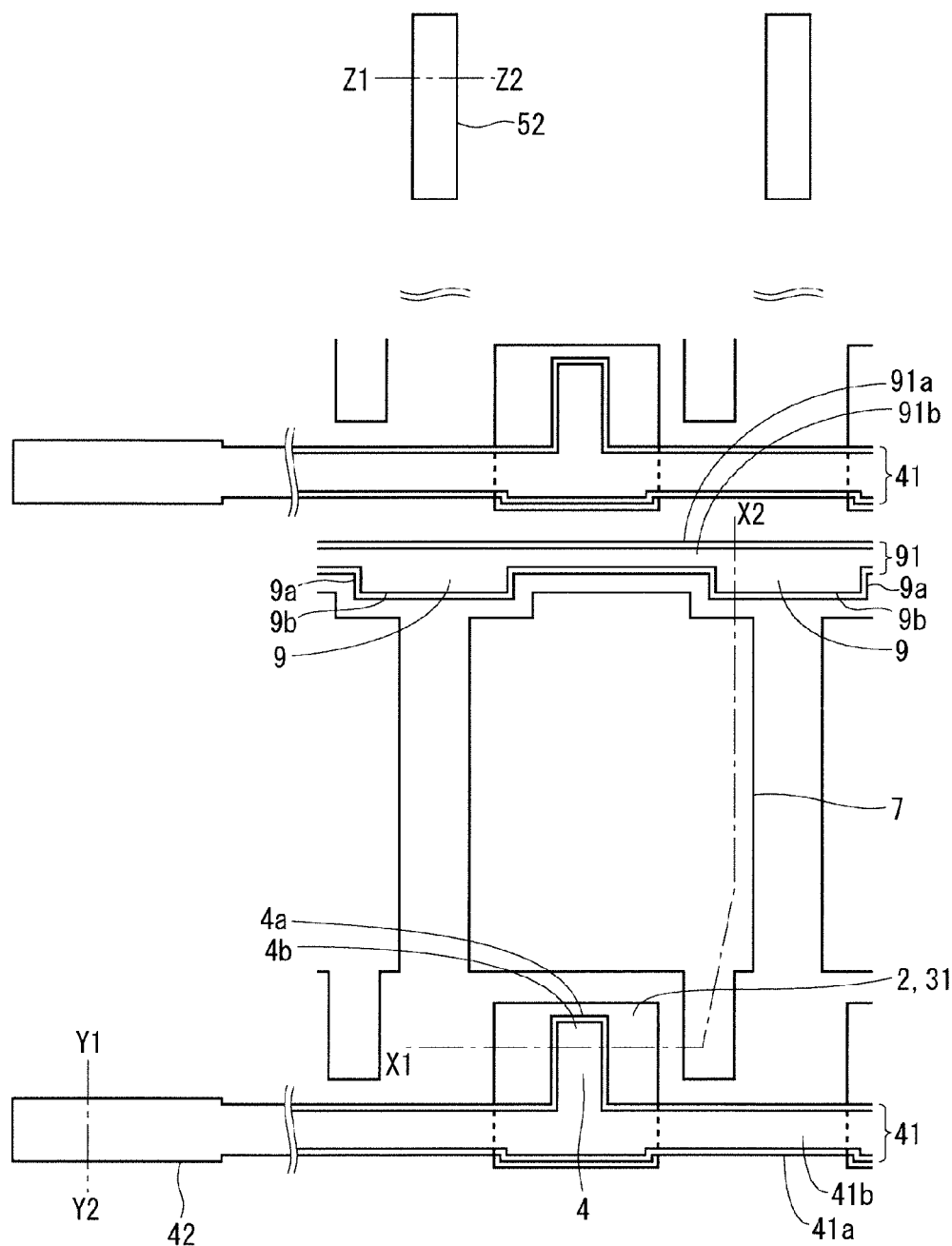
Figure 6:
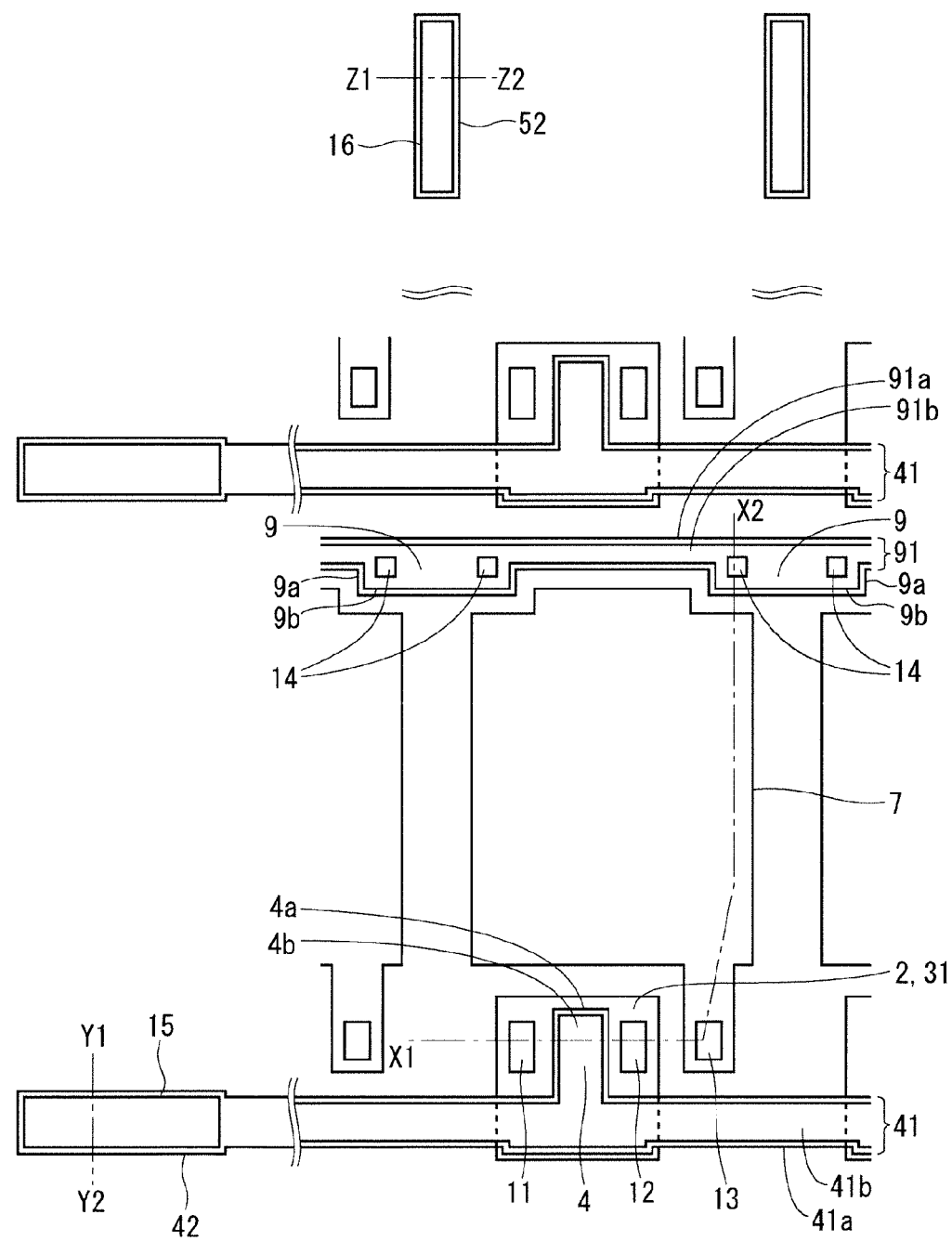
Figure 7:
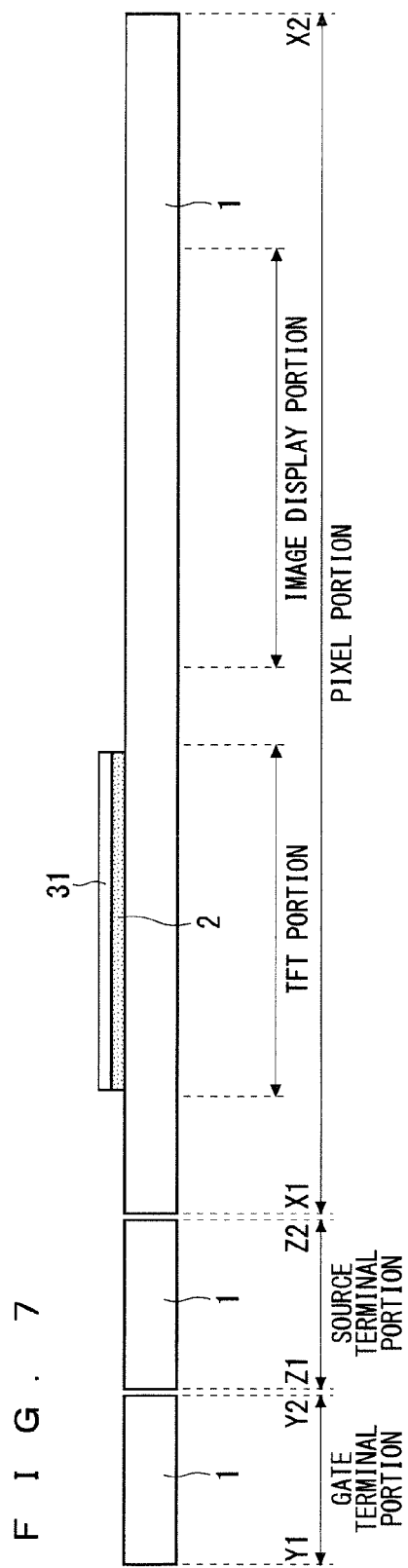
FIGS. 7 to 9 are process diagrams in cross section showing the method for manufacturing the TFT substrate according to the first preferred embodiment.
Figure 8:
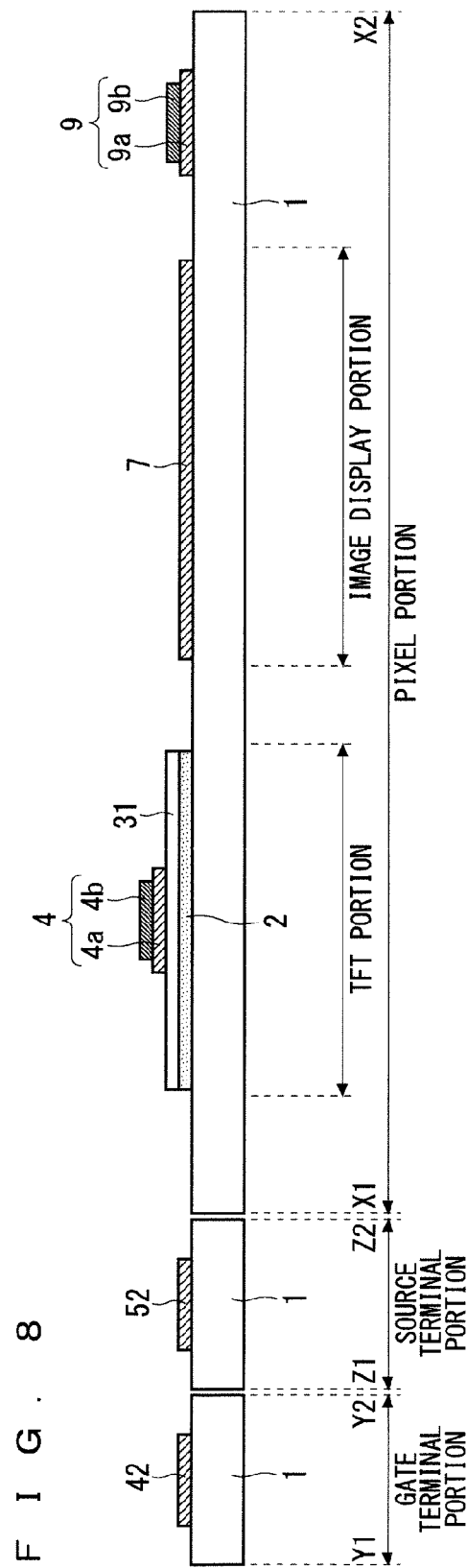
Figure 9:
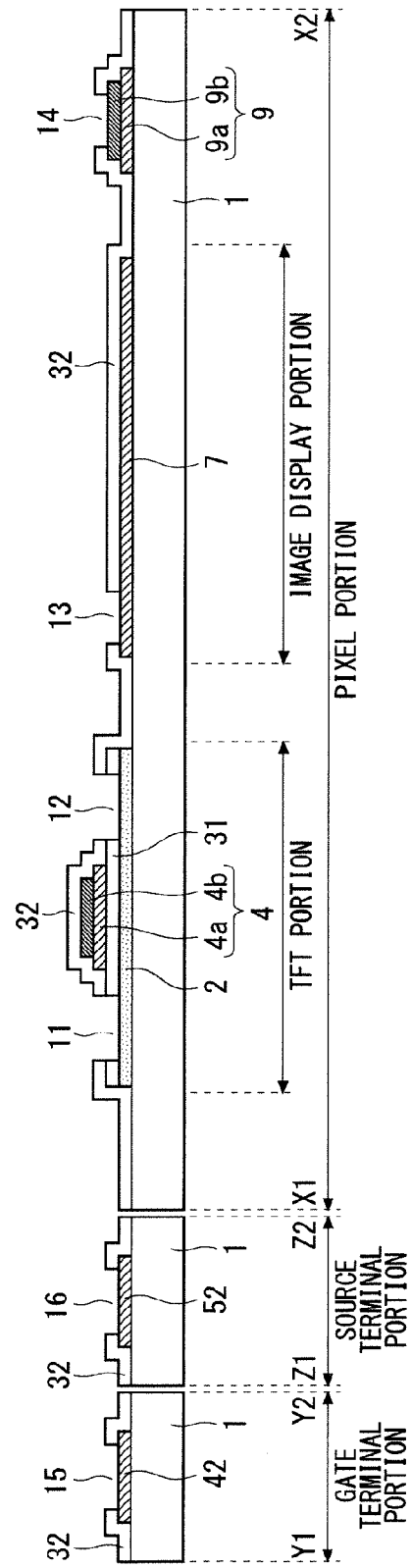

Next, a method for manufacturing the TFT substrate 200 according to the first preferred embodiment will be described with reference to FIGS. 4 to 9. FIGS. 4 to 6 are process diagrams in plan view showing each step of the method for manufacturing the TFT substrate 200. FIGS. 7 to 9 are process diagrams in cross section showing each step of the method for manufacturing the TFT substrate 200. In addition, FIGS. 4 to 6 are plan views corresponding to FIGS. 7 to 9, respectively. In FIGS. 4 to 9, the same components corresponding to those shown in FIGS. 2 and 3 are denoted by the same references.

First, the surface of the substrate 1 is cleaned with cleaning liquid or pure water. Here, a glass substrate having a thickness of 0.6 mm is used as the substrate 1. A laminated film including the semiconductor film being the material for the semiconductor channel film 2 of the TFT 201 and the first insulating film being the material for the gate insulating film 31 laminated in the stated order is formed on the substrate 1 that has been cleaned. In this preferred embodiment, an oxide semiconductor of an InGaZnO system (InGaZnO film) in which a gallium oxide ($Ga_2O_3$) and a zinc oxide (ZnO) are added to an indium oxide ($In_2O_3$) is used as the semiconductor film. A silicon oxide (SiO) is used as the first insulating film.

The InGaZnO film can be formed by a DC sputtering method with a InGaZnO target $[In_2O_3.(Ga_2O_3).(ZnO)_2]$ in which an atomic composition ratio of In:Ga:Zn:O is 1:1:1:4. An argon (Ar) gas, a krypton (Kr) gas, or the like can be used as a sputtering gas. At this time, the sputtering with only the Ar gas or the Kr gas normally forms an oxide film that has the atomic composition ratio of oxygen less than a stoichiometry composition and is in a state of lacking in oxygen ions (composition ratio of O is less than 4 in the example above). Thus, it is desirable to mix the Ar gas with an oxygen ($O_2$) gas to perform the sputtering. Here, a mixture gas in which the $O_2$ gas having the partial pressure ratio of 10% to the Ar gas is added to the Ar gas is used to perform the sputtering, and the InGaZnO film having a thickness of 50 nm is formed, to thereby form the semiconductor film. The InGaZnO film has an amorphous structure immediately after being formed.

The SiO film can be formed by a plasma chemical vapor deposition (CVD) method with a silane ($SiH_4$) gas and a nitrous oxide ($N_2O$) gas. Here, the SiO film is formed to have a thickness of 300 nm, to thereby form the first insulating film.

Subsequently, a first photolithography step processes a photoresist to form a photoresist pattern, and the laminated film including the semiconductor film and the first insulating film is patterned by etching with the photoresist pattern as a mask, to thereby form the semiconductor channel film 2 and the gate insulating film 31. In this preferred embodiment, first, the first insulating film (SiO film) is etched by a dry etching method with sulfur hexafluoride ($SF_6$) gas and the $O_2$ gas, and then the semiconductor film (InGaZnO film) is etched with a chemical solution of oxalic acid. Subsequently, the photoresist pattern is separated and removed with a photoresist removing liquid of an amine, to thereby form the laminated structure including the semiconductor channel film 2 and the gate insulating film 31 on the substrate 1 as shown in FIGS. 4 and 7.

Next, a laminated film being the material for the gate electrode 4, the pixel electrode 7, and the common electrode 9 and including the first conductive film and the second conductive film laminated in the stated order is formed on the substrate 1. In this preferred embodiment, a light-transmissive ITO film formed of the indium oxide ($In_2O_3$) and a tin oxide ($SnO_2$) is used as the first conductive film, and an aluminum (Al) alloy film of metal, and more specifically, an alloy metal in which Ni of 3 mol % is added to Al (Al-3 mol % Ni film) is used as the second conductive film.

The ITO film can be formed by the sputtering method with an ITO target. Here, the ITO film is formed to have a thickness of 100 nm, to thereby form the first conductive film. An indium zinc oxide (InZnO) or the like except for the ITO can be used as the first conductive film.

The Al-3 mol % Ni film can be formed by the sputtering method with a Al-3 mol % Ni alloy target. Here, the Al-3 mol % Ni film having a thickness of 200 nm is formed, to thereby form the second conductive film. In addition, the Ar gas or the Kr gas can be used as the sputtering gas.

Subsequently, a second photolithography step forms a photoresist pattern, and the first conductive film and the second conductive film are patterned by etching with the photoresist pattern as a mask, to thereby form the gate electrode 4, the gate wires 41, the pixel electrode 7, the common electrode 9, the common wires 91, the gate terminal 42, and the source terminal 52. In this preferred embodiment, the second conductive film (Al-3 mol % Ni film) is etched with a chemical solution of phosphoric acid+acetic acid+nitric acid (PAN), and then the first conductive film (ITO film) is etched with the chemical solution of oxalic acid.

In this step, with the application of a half-tone exposure technique (described in detail below), the second conductive film is removed from each region for forming the pixel electrode 7, the gate terminal 42, and the source terminal 52, and the second conductive film remains in each region for forming the gate electrode 4, the gate wires 41, the common electrode 9, and the common wires 91.

In other words, the half-tone exposure technique forms a photoresist pattern including a thin first photoresist portion that covers each region for forming the pixel electrode 7, the gate terminal 42, and the source terminal 52 and a thick second photoresist portion that covers each region for forming the gate electrode 4, the gate wires 41, the common electrode 9, and the common wires 91, to thereby remove the first conductive film and the second conductive film by etching with the photoresist pattern as a mask. Consequently, each pattern is formed for the gate electrode 4, the gate wires 41, the pixel electrode 7, the common electrode 9, the common wires 91, the gate terminal 42, and the source terminal 52. Then, the thickness of the photoresist pattern is reduced by ashing to remove the first photoresist portion, and the second conductive film is removed by etching with the remaining portion of the second photoresist portion as a mask. This removes the second conductive film from the upper portions of the pixel electrode 7, the gate terminal 42, and the source terminal 52.

Subsequently, the photoresist pattern is separated and removed with the photoresist removing liquid of the amine, to thereby form the gate electrode 4, the gate wires 41, the pixel electrode 7, the common electrode 9, the common wires 91, the gate terminal 42, and the source terminal 52 as shown in FIGS. 5 and 8. The half-tone exposure technique allows the gate electrode 4, the gate wires 41, the common electrode 9, and the common wires 91 to have the laminated structure including the first conductive film and the second conductive film while the half-tone exposure technique allows the pixel electrode 7, the gate terminal 42, and the source terminal 52 to have the single-layer structure including the first conductive film. The gate electrode 4 and the gate wires 41 have the laminated structure including the ITO film and the Al-3 mol % Ni film, whereby the gate wire resistance can be reduced and a large panel having the increasing wire resistance particularly caused by a long wire length can be handled.

As described above, the first conductive film (ITO film) and the second conductive film (Al-3 mol % Ni film) are etched with the chemical solution of the oxalic acid and the acid chemical solution of the PAN, respectively. Upon the etching step, the gate insulating film 31 being the first insulating film (SiO film) covers the semiconductor channel film 2 (InGaZnO film) for protection. This prevents the semiconductor channel film 2 from being etched, thereby being kept in an excellent pattern shape.

Moreover, the first insulating film forming the gate insulating film 31 has the single-layer structure including the SiO film here, and the first insulating film may have the laminated structure further including the insulating film provided on the SiO film. The upper layer of the insulating film may be the SiO film and may also be the insulating film formed of the other material such as silicon nitride (SiN). The first insulating film has the laminated structure, allowing for the greater coverage as a protective film.

Next, the second insulating film being the material for the interlayer insulating film 32 is formed entirely on the substrate 1. In this preferred embodiment, the SiO film is formed to have the thickness of 300 nm by the chemical vapor deposition (CVD) method, to thereby form the interlayer insulating film 32. In addition, the second insulating film forming the interlayer insulating film 32 may also have the laminated structure similarly to the first insulating film.

After that, a third photolithography step forms a photoresist pattern, and the interlayer insulating film 32 and the gate insulating film 31 are etched with the photoresist pattern as a mask, to thereby form the contact holes 11 to 16. This preferred embodiment uses the dry etching method with the sulfur hexafluoride ($SF_6$) and the $O_2$ gas. Subsequently, the photoresist pattern is separated and removed with the photoresist removing liquid of the amine. As a result, as shown in FIGS. 6 and 9, the contact hole 11 and the contact hole 12 reaching the semiconductor channel film 2, the contact hole 13 reaching the pixel electrode 7, the contact hole 14 reaching the common electrode 9, the contact hole 15 reaching the gate terminal 42, and the contact hole 16 reaching the source terminal 52 are formed.

Then, a laminated film including the third conductive film and the fourth conductive film laminated in the stated order is formed on the interlayer insulating film 32 including the inside of the contact holes 11 to 16. In this preferred embodiment, the light-transmissive ITO film is formed to have the thickness of 100 nm as the third conductive film, and the Al-3 mol % alloy film is formed to have the thickness of 200 nm as the fourth conductive film.

After that, a fourth photolithography step forms a photoresist pattern, and the third conductive film and the fourth conductive film are patterned by etching with the photoresist pattern as a mask, to thereby form the source electrode 5, the source wires 51, the drain electrode 6, the counter electrode 8, the gate terminal pad 43, and the source terminal pad 53. In this preferred embodiment, the third conductive film (ITO film) is etched with the chemical solution of the oxalic acid, and the fourth conductive film (Al-3 mol % Ni film) is subsequently etched with the chemical solution of the PAN. Also in this step, with the application of the half-tone exposure technique, the fourth conductive film is removed from each region for forming the drain electrode 6, the counter electrode 8, the gate terminal pad 43, and the source terminal pad 53, and the fourth conductive film remains in each region for forming the source electrode 5 and the source wires 51.

In other words, the half-tone exposure technique forms a photoresist pattern including a thin first photoresist portion that covers each region for forming the drain electrode 6, the counter electrode 8, the gate terminal pad 43, and the source terminal pad 53 and a thick second photoresist portion that covers each region for forming the source electrode 5 and the source wires 51, to thereby remove the third conductive film and the fourth conductive film by etching with the photoresist pattern as a mask. Consequently, each pattern is formed for the drain electrode 6, the source electrode 5, the source wires 51, the counter electrode 8, the gate terminal pad 43, and the source terminal pad 53. Then, the thickness of the photoresist pattern is reduced by ashing to remove the first photoresist portion, and the fourth conductive film is removed by etching with the remaining portion of the second photoresist portion as a mask. This removes the fourth conductive film from the upper portions of the drain electrode 6, the counter electrode 8, the gate terminal pad 43, and the source terminal pad 53.

The photoresist pattern is then separated and removed with the photoresist removing liquid of the amine to form the source electrode 5, the source wires 51, the drain electrode 6, the counter electrode 8, the gate terminal pad 43, and the source terminal pad 53, to thereby form the TFT substrate 200 having the configuration shown in FIGS. 2 and 3. The half-tone exposure technique allows the source electrode 5 and the source wires 51 to have the laminated structure including the third conductive film and the fourth conductive film, and the half-tone exposure technique allows the drain electrode 6, the counter electrode 8, the gate terminal pad 43, and the source terminal pad 53 to have the single-layer structure including the third conductive film.

In this manner, the drain electrode 6 and the counter electrode 8 are formed to have the single-layer structure including the ITO film, whereby the light-transmissive region of the image display portion, namely, an aperture ratio can be increased. The gate terminal pad 43 and the source terminal pad 53 are formed of the ITO film being the oxide conductive film, and thus connection characteristics when a wire substrate such as an FPC for inputting a scanning signal or a display signal from the outside is connected to (mounted on) a terminal portion can be improved, and reliability can thus be improved.

On the other hand, the source electrode 5 and the source wires 51 have the laminated structure including the ITO film and the Al-3 mol % Ni film, whereby the source wire resistance can be reduced and the large panel having the increasing wire resistance particularly caused by the long wire length can be handled.

As described above, the TFT substrate 200 of the first preferred embodiment shown in FIGS. 2 and 3 can be formed in the four photolithography steps with great productivity.

Upon assembly of the liquid crystal display panel, an alignment film and spacers are formed on the surface of the TFT substrate 200 that has been completed. The alignment film is a film that aligns liquid crystals and is made of polyimide or the like. The counter substrate that has been formed separately and includes the color filter and the alignment film is bonded to the TFT substrate 200. At this time, the spacers create gap between the TFT substrate 200 and the counter substrate. The liquid crystals are injected into the gap and sealed, to thereby form the liquid crystal display panel. In the end, the polarizing plate, the phase difference plate, and the backlight unit are disposed on the outer side of the liquid crystal display panel, to thereby complete the LCD of the FFS mode.

In the TFT substrate 200 of the first preferred embodiment, the semiconductor channel film 2 of the TFT 201 is disposed in the lowest layer, so that the light from the backlight unit is directly incident on the semiconductor channel film 2. In a case where the semiconductor channel film 2 is the Si film, ON/OFF ratio, which is one of TFT characteristics, may degrade due to photocarrier generation, but the degradation in the ON/OFF ratio can be suppressed if the semiconductor channel film 2 is made of the oxide semiconductor as in this preferred embodiment. Therefore, the liquid crystal display device having a high contrast ratio and a high display quality without display unevenness can be realized.

Moreover, the semiconductor channel film 2 made of the oxide semiconductor allows for a high mobility of the TFT 201, whereby the TFT substrate 200 with high operation speed can be obtained. Therefore, the TFT can be reduced in size, and the aperture ratio of the image display portion can be increased. This enables a display at high luminance even with the reduced emitting light from the backlight unit, which can also contribute to a reduction in power consumption.

Modification of First Preferred Embodiment

Figure 10:
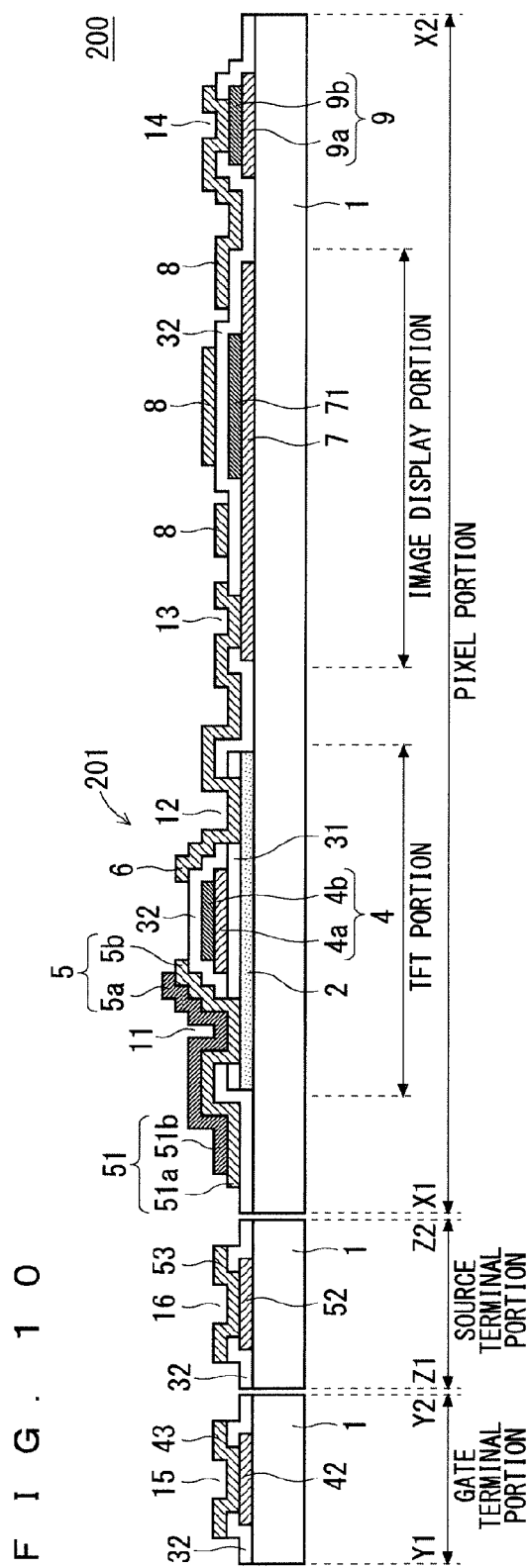
FIG. 10 is a cross-sectional view showing a TFT substrate according to a modification of the first preferred embodiment.

FIG. 10 is a cross-sectional view showing a TFT substrate 200 according to a modification of the first preferred embodiment. The first preferred embodiment described above exemplifies the transmissive TFT substrate 200 in which the light passes through the whole pixel electrode 7. As shown in FIG. 10, a reflective pixel electrode 71 that reflects light is provided in a fixed area on the pixel electrode 7, whereby the semi-transmissive TFT substrate 200 can also be manufactured.

The reflective pixel electrode 71 is formed of the same second conductive film (metal film such as the Al-3 mol % Ni film) as that of the gate electrode upper layer portion 4b of the gate electrode 4, so that a manufacturing step is not increased. In other words, upon the formation of the pixel electrode 7 in the second photolithography step, with the application of the half-tone exposure technique, the second conductive film remains on part of the region for forming the pixel electrode 7 similar to the region for forming the gate electrode 4 and the gate wires 41, and thus the second conductive film on part of the region for forming the pixel electrode 7 can be the reflective pixel electrode 71.

Changing the area or the shape of the pattern of the reflective pixel electrode 71 formed on the pixel electrode 7 can arbitrarily set the ratio of the transmitted light and the reflected light of the semi-transmissive electrode. Moreover, if the reflective pixel electrode 71 is formed on almost the entire surface of the pixel electrode 7, the full reflective TFT substrate 200 can be manufactured.

Second Preferred Embodiment

The first preferred embodiment shows the method for forming the TFT substrate 200 of the FFS mode in at least the four photolithography steps, the TFT substrate 200 of the FFS mode having the configuration that can easily apply, to the semiconductor film (semiconductor channel film) serving as the channel layer of the TFT, the oxide semiconductor film with poor resistance to acid chemical solution. A second preferred embodiment shows a method for forming a TFT substrate 200 having almost the same configuration as that above in at least three photolithography steps.

FIG. 11 is a diagram showing a planar configuration of a main part including the pixel 204 in the TFT substrate 200 according to the second preferred embodiment, and FIG. 12 is a cross-sectional configuration thereof. FIG. 12 shows corresponding cross sections taken along an X1-X2 line, a Y1-Y2 line, and a Z1-Z2 line shown in FIG. 11. In FIGS. 11 and 12, the components having the same functions as those described in the first preferred embodiment (FIGS. 2 and 3) are denoted by the same references, which are not described here. The TFT substrate 200 has the whole configuration similar to that in the first preferred embodiment (FIG. 1).

The cross section taken along the X1-X2 line in FIG. 12 corresponds to the region (pixel portion) for forming the pixel 204 and includes the "TFT portion" that is the region for forming the TFT 201 and the "image display portion" that is the region for forming the pixel electrode 7 and the counter electrode 8. The cross section taken along the Y1-Y2 line corresponds to the region (gate terminal portion) for forming the gate terminal 42 and the gate terminal pad 43, and the cross section taken along the Z1-Z2 line corresponds to the region (source terminal portion) for forming the source terminal 52 and the source terminal pad 53.

As seen from FIGS. 11 and 12, the TFT substrate 200 of the second preferred embodiment has almost the same configuration of the first preferred embodiment (FIGS. 2 and 3), but the TFT substrate 200 has a laminated structure including a semiconductor film 101 in the same layer as the semiconductor channel film 2 and a first insulating film 102 in the same layer as the gate insulating film 31 also formed under the gate wires 41, the pixel electrode 7, the common electrode 9, the common wires 91, the gate terminal 42, and the source terminal 52. In other words, the semiconductor film 101 being the material for the semiconductor channel film 2 and the first insulating film 102 being the material for the gate insulating film 31 are located not only in the TFT portion but also under each component formed of the first conductive film or the second conductive film.

Figure 13:
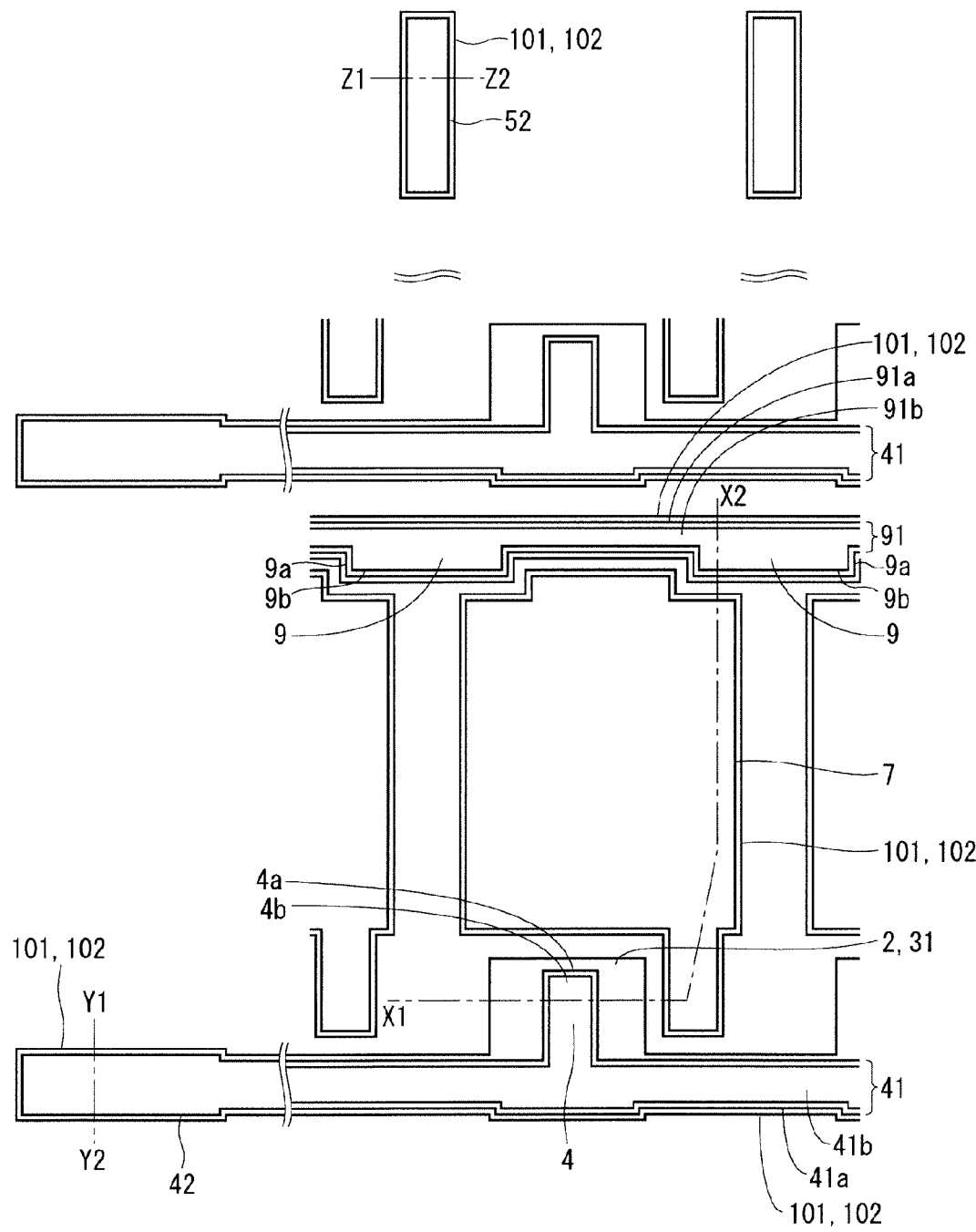
FIGS. 13 and 14 are process diagrams in plan view showing a method for manufacturing the TFT substrate according to the second preferred embodiment.
Figure 14:
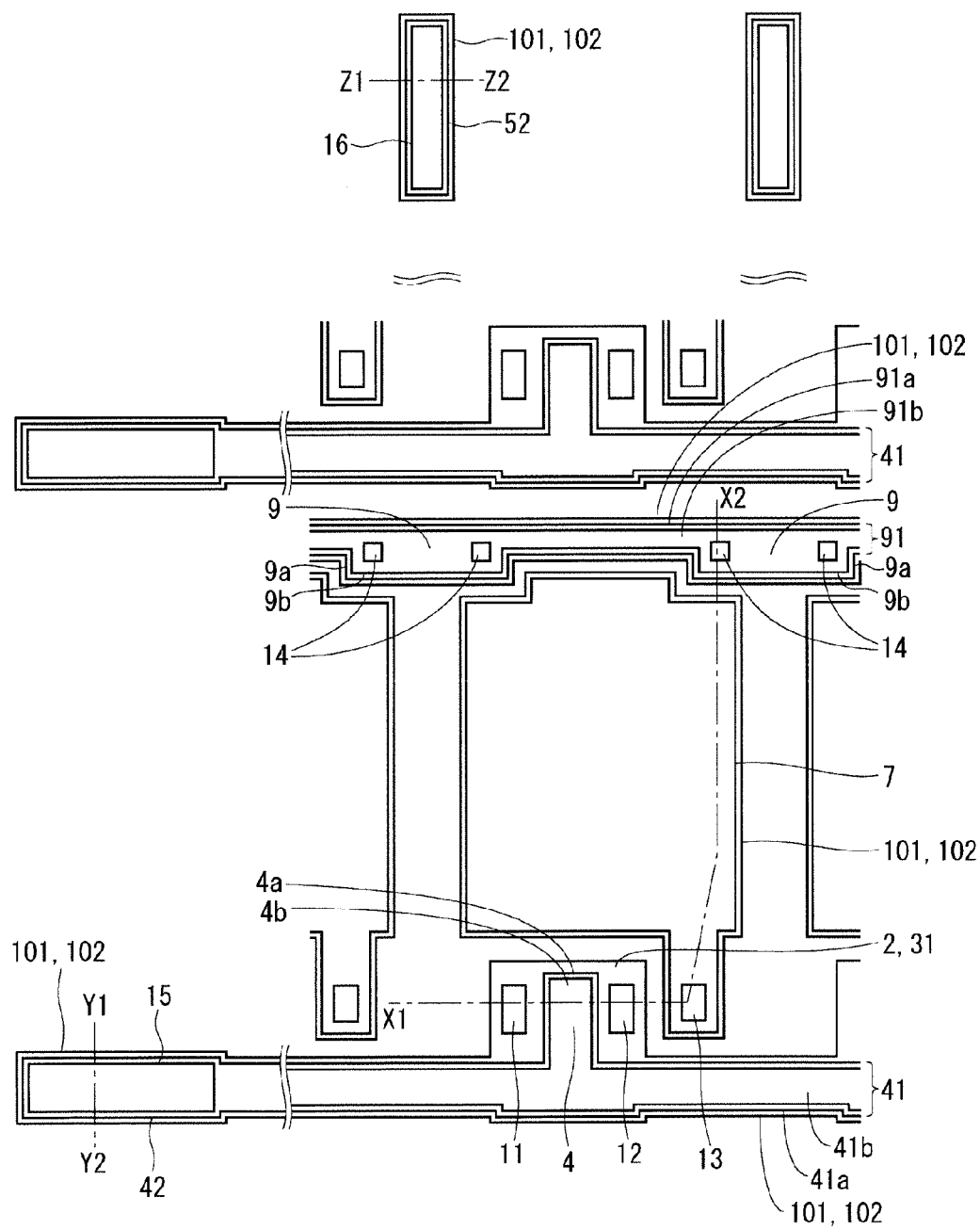

Next, a method for manufacturing the TFT substrate 200 according to the second preferred embodiment will be described with reference to FIGS. 13 to 22. FIGS. 13 and 14 are process diagrams in plan view showing each step of the method for manufacturing the TFT substrate 200, and FIGS. 15 to 22 are process diagrams in cross section showing each step of the method for manufacturing the TFT substrate 200. FIGS. 13 and 14 are plan views corresponding to FIGS. 21 and 22, respectively. In these diagrams, components corresponding to those shown in FIGS. 11 and 12 are denoted by the same references.

Figure 15:
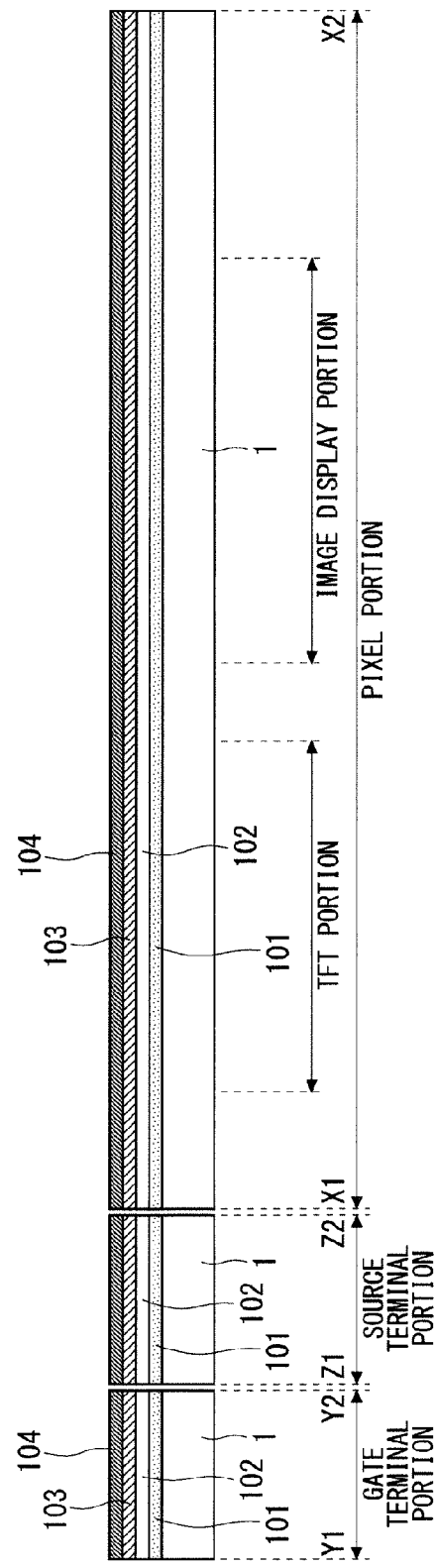
FIGS. 15 to 22 are process diagrams in cross section showing the method for manufacturing the TFT substrate according to the second preferred embodiment.

First, the surface of the substrate 1 is cleaned with cleaning liquid or pure water. As shown in FIG. 15, a laminated film including the semiconductor film 101 being the material for the semiconductor channel film 2, the first insulating film 102 being the material for the gate insulating film 31, a first conductive film 103 and a second conductive film 104 being the materials for the gate electrode 4 and the pixel electrode 7 laminated in the stated order is formed on the substrate 1 that has been cleaned.

Also in this preferred embodiment similar to the first preferred embodiment, the InGaZnO film being the oxide semiconductor, the silicon oxide (SiO) film, the light-transmissive ITO film, and the Al-3 mol % Ni film being the aluminum (Al) alloy are used for the semiconductor film 101, the first insulating film 102, the first conductive film 103, and the second conductive film 104, respectively. In addition, their thicknesses and the method for forming them may be the same as those in the first preferred embodiment.

Figure 16:
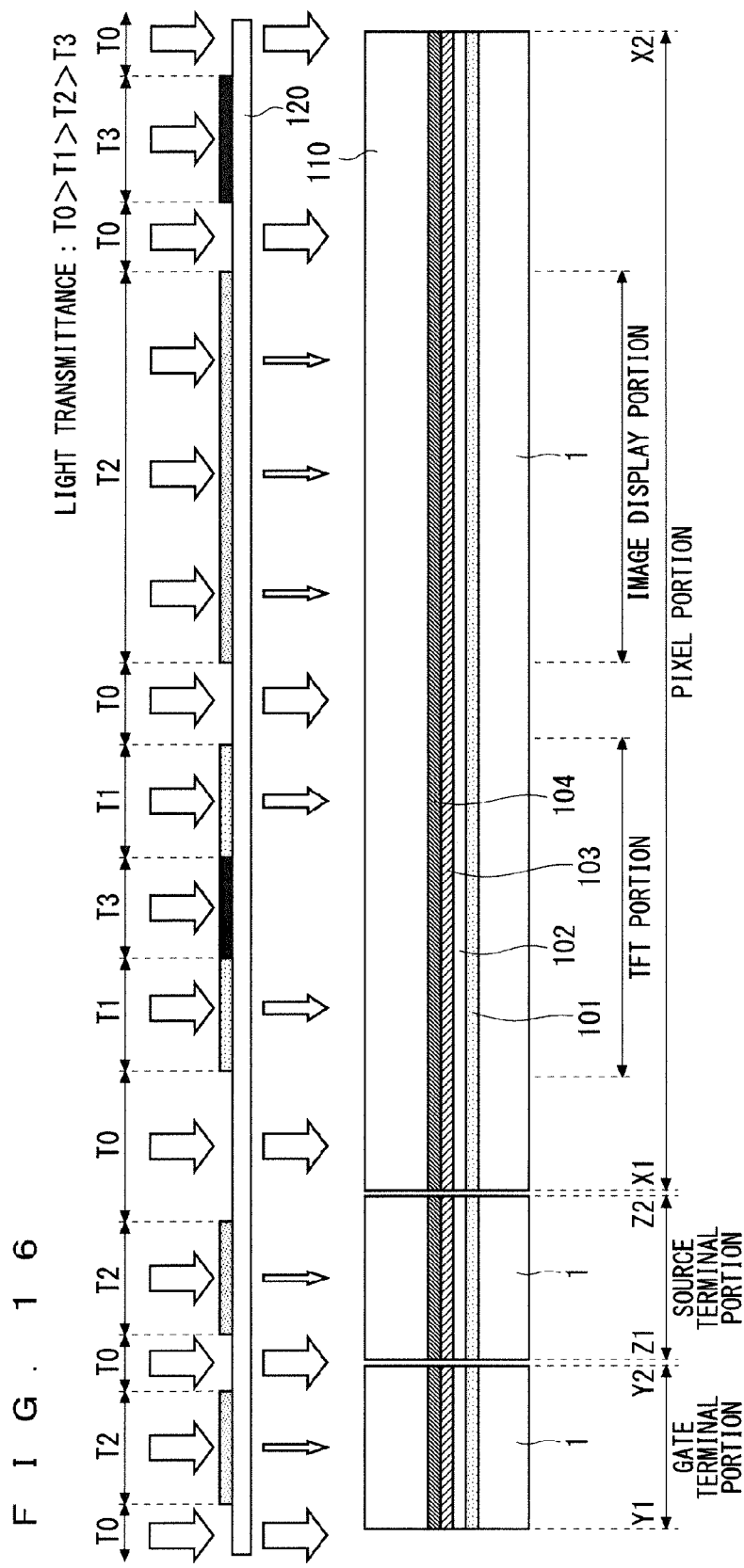

Subsequently, a first photolithography step forms a photoresist pattern. First of all, a photoresist 110 made of novolac photosensitive resin of the positive type is formed on the laminated film including the semiconductor film 101, the first insulating film 102, the first conductive film 103, and the second conductive film 104 to have a thickness of approximately 1.5 nm by a coating method. Then, as shown in FIG. 16, exposure is performed on the photoresist 110 with a photomask 120.

The photomask 120 includes a light-shielding film formed in regions corresponding to regions each forming the semiconductor channel film 2 of the TFT 201, the gate electrode 4, the gate wires 41, the pixel electrode 7, the common electrode 9, the common wires 91, the gate terminal 42, and the source terminal 52, and part of the light-shielding film is a semi-transmissive film reducing light intensity of the exposure. Furthermore, the semi-transmissive film includes two kinds of films having different transmittances. In other words, the photomask 120 has transmissive regions T0 without the light-shielding film, a first semi-transmissive region T1 with the semi-transmissive film having the high transmittance, a second semi-transmissive region T2 with the semi-transmissive film having the low transmittance, and a light-shielding region T3 with the light-shielding film that shields light (light transmittance of each region is in a relationship of T0>T1>T2>T3). Thus, the intensity of the light that passes through the photomask 120 has three levels.

Specifically, in the photomask 120, the portion corresponding to the region for forming the semiconductor channel film 2 except for the region for forming the gate electrode 4 is the first semi-transmissive region T1. The portions corresponding to the regions for forming the pixel electrode 7, the gate terminal 42, and the source terminal 52 are the second semi-transmissive regions T2. Furthermore, the portions corresponding to the regions for forming the gate electrode 4, the gate wires 41, the common electrode 9, and the common wires 91 are the light-shielding regions T3. The other regions are the transmissive regions T0. In other words, the transmissive regions T0 are disposed correspondingly to the regions from which all the four layers of the semiconductor film 101, the first insulating film 102, the first conductive film 103, and the second conductive film 104 are removed, the first semi-transmissive region T1 is disposed correspondingly to the region in which the lowest two layers remain, the second semi-transmissive regions T2 are disposed correspondingly to the regions in which the lowest three layers remain, and the light-shielding regions T3 are disposed in the regions in which all of the four layers remain.

The photomask having many levels of the transmittances is referred to as a "half-tone mask," and the exposure of the photoresist with the half-tone mask is referred to as a "half-tone exposure".

After performing the half-tone exposure of the photoresist 110 with the photomask 120 (half-tone mask), a development is performed with a developing solution of an organic alkali including a tetramethylammonium hydroxide (TMAH). Consequently, the portions of the photoresist 110 corresponding to the transmissive regions T0 of the photomask 120 are removed while the portions of the photoresist 110 corresponding to the first semi-transmissive regions T1, the second semi-transmissive regions T2, and the light-shielding regions T3 remain with the thicknesses according to the intensity of the transmitted light of each region.

Figure 17:
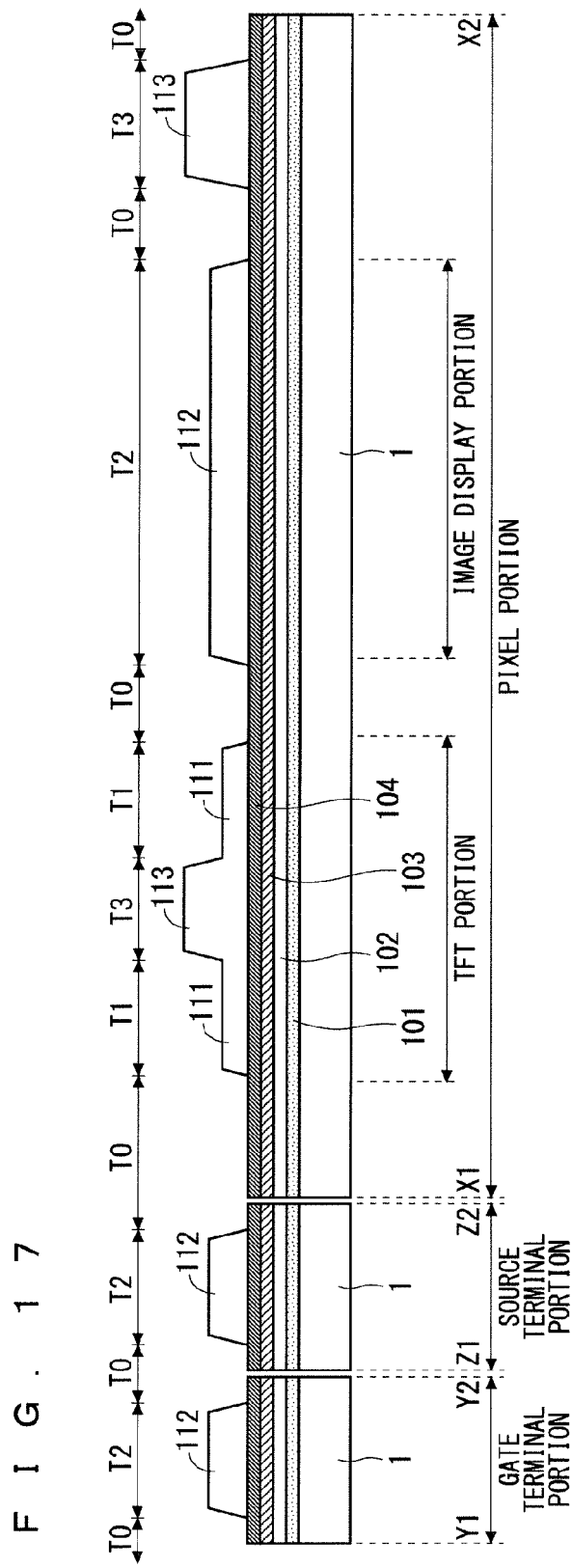

Therefore, as shown in FIG. 17, the photoresist 110 is processed into a photoresist pattern having three kinds of thicknesses. Specifically, the photoresist 110 is processed into the photoresist pattern formed of a thin first photoresist portion 111 that covers the region for forming the semiconductor channel film 2 except for the region for forming the gate electrode 4, second photoresist portions 112 that are thicker than the first photoresist portion 111 and cover the regions for forming the pixel electrode 7, the gate terminals 42, and the source terminals 52, and third photoresist portions 113 that are thicker than the second photoresist portions 112 and cover the regions for forming the gate electrode 4, the gate wires 41, the common electrode 9, and the common wires 91. In this preferred embodiment, the thinnest first photoresist portion 111 has the thickness of 0.5 nm.

Figure 18:
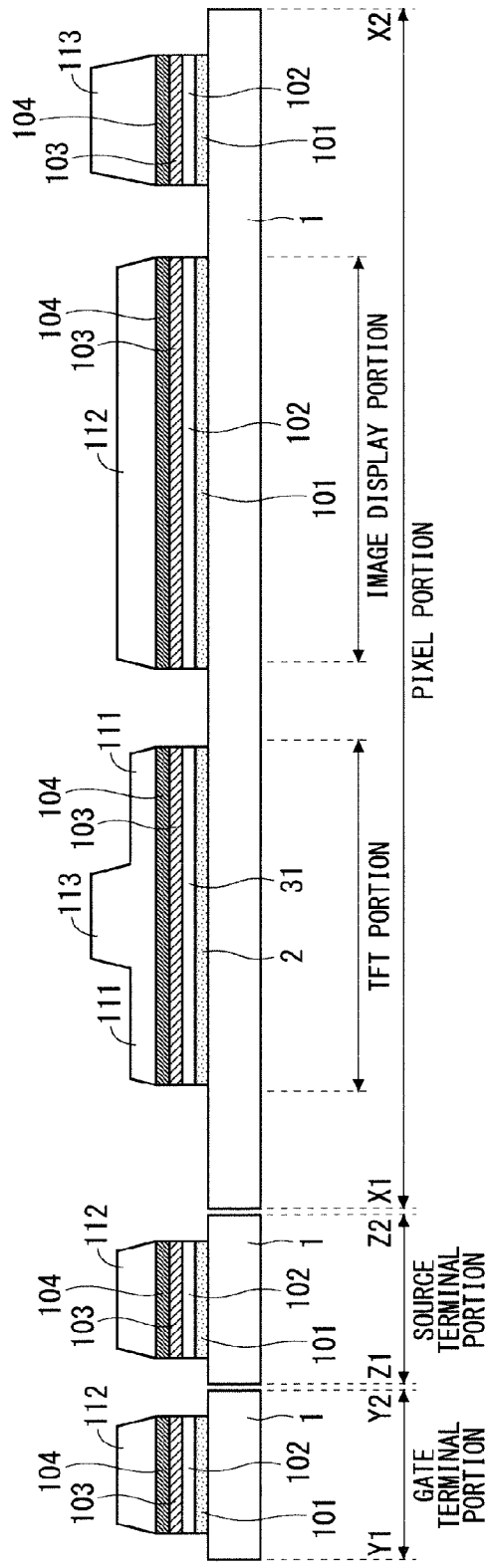

Next, as shown in FIG. 18, the second conductive film 104, the first conductive film 103, the first insulating film 102, and the semiconductor film 101 are successively removed by etching with the first photoresist portion 111, the second photoresist portions 112, and the third photoresist portions 113 as masks. In this preferred embodiment, the second conductive film 104 (Al-3 mol % Ni film) is removed by etching with a chemical solution of PAN, the first conductive film 103 (ITO film) is removed by etching with a chemical solution of oxalic acid, the first insulating film 102 (SiO film) is removed by a dry etching method with fluorine gas such as sulfur hexafluoride ($SF_6$) gas and $O_2$ gas, and the semiconductor film 101 (InGaZnO film) is removed by etching with the chemical solution of the oxalic acid again. This etching step forms the pattern of the semiconductor channel film 2 formed of the semiconductor film 101 and the gate insulating film 31 formed of the first insulating film 102.

Subsequently, the photoresist pattern is ashed with $O_2$ gas plasma to remove the first photoresist portion 111 and also to reduce the thicknesses of the second photoresist portions 112 and the third photoresist portions 113 (the second photoresist portions 112 and the third photoresist portions 113 remain). In other words, the photoresist pattern after the ashing has the two kinds of the thicknesses formed of the second photoresist portions 112 and the third photoresist portions 113 in which their thicknesses have been reduced.

Figure 19:
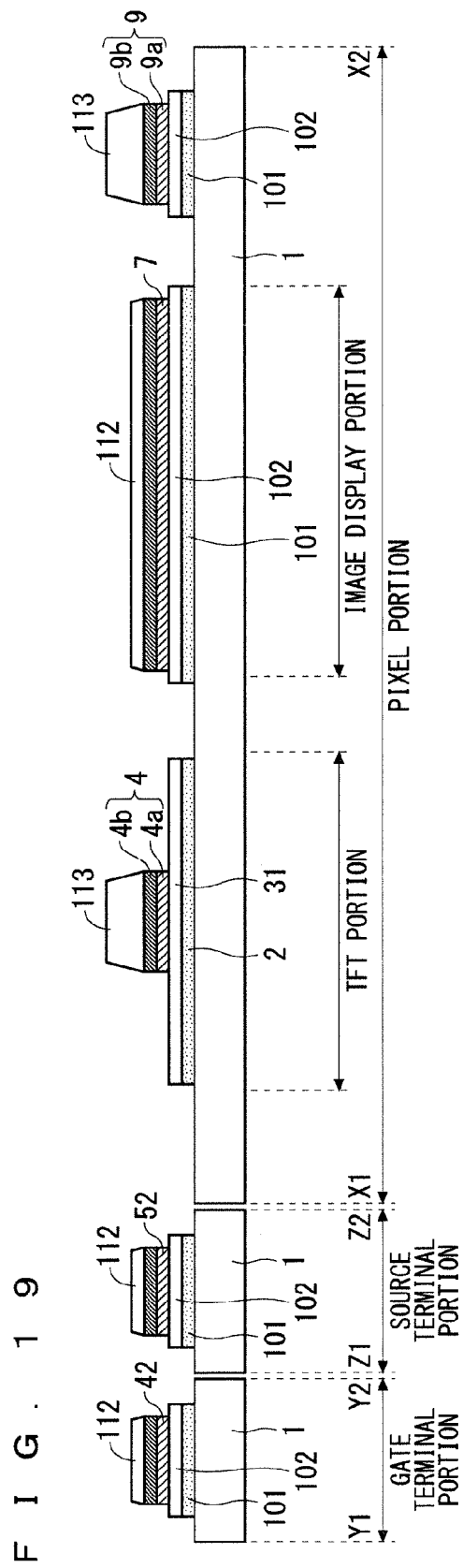

Then, as shown in FIG. 19, the second conductive film 104 and the first conductive film 103 are successively removed by etching with the second photoresist portions 112 and the third photoresist portions 113 as masks. Here, the second conductive film 104 (Al-3 mol % Ni film) is also removed by etching with the chemical solution of the PAN, and the first conductive film 103 (ITO film) is also removed by etching with the chemical solution of the oxalic acid.

This etching step forms each pattern for the gate electrode 4 (gate electrode lower layer portion 4a and gate electrode upper layer portion 4b), the gate wires 41 (gate wire lower layer portion 41a and gate wire upper layer portion 4b), the common electrode 9 (common electrode lower layer portion 9a and common electrode upper layer portion 9b), and the common wires 91 (common wire lower layer portion 91a and common wire upper layer portion 91b), each of them having the laminated structure including the first conductive film 103 and the second conductive film 104. At this point, each pattern for the pixel electrode 7, the gate terminals 42, and the source terminals 52 are also formed, and the second conductive film 104 is in a state of remaining on the pixel electrode 7, the gate terminals 42, and the source terminals 52.

Next, the photoresist pattern is ashed again to remove the second photoresist portions 112 and also to reduce the thickness of the third photoresist portions 113 (third photoresist portions 113 remain). In other words, the photoresist pattern after the ashing is formed of only the third photoresist portions 113 in which the thickness has been reduced.

Figure 20:
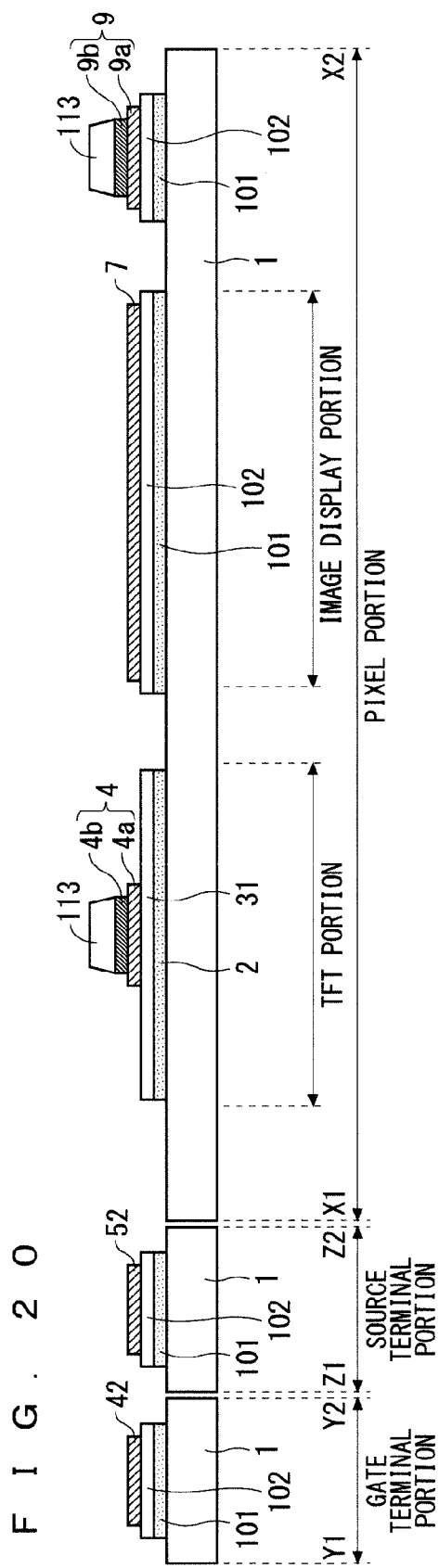

Then, as shown in FIG. 20, the second conductive film 104 is removed by etching with the third photoresist portions 113 as a mask. Here, the second conductive film 104 (Al-3 mol % Ni film) is removed by etching with the chemical solution of the PAN. This etching step removes the second conductive film 104 remaining on the pixel electrode 7, the gate terminal 42, and the source terminal 52. Prior to the etching, the substrate 1 may be subjected to a heat treatment in temperatures greater than or equal to 150° C. In a case where the first conductive film 103 is made of an oxide material, such as the ITO, the first conductive film 103 may be slightly etched while the second conductive film 104 is etched with the chemical solution of the PAN. This can be prevented by the heat treatment before the etching.

Figure 21:
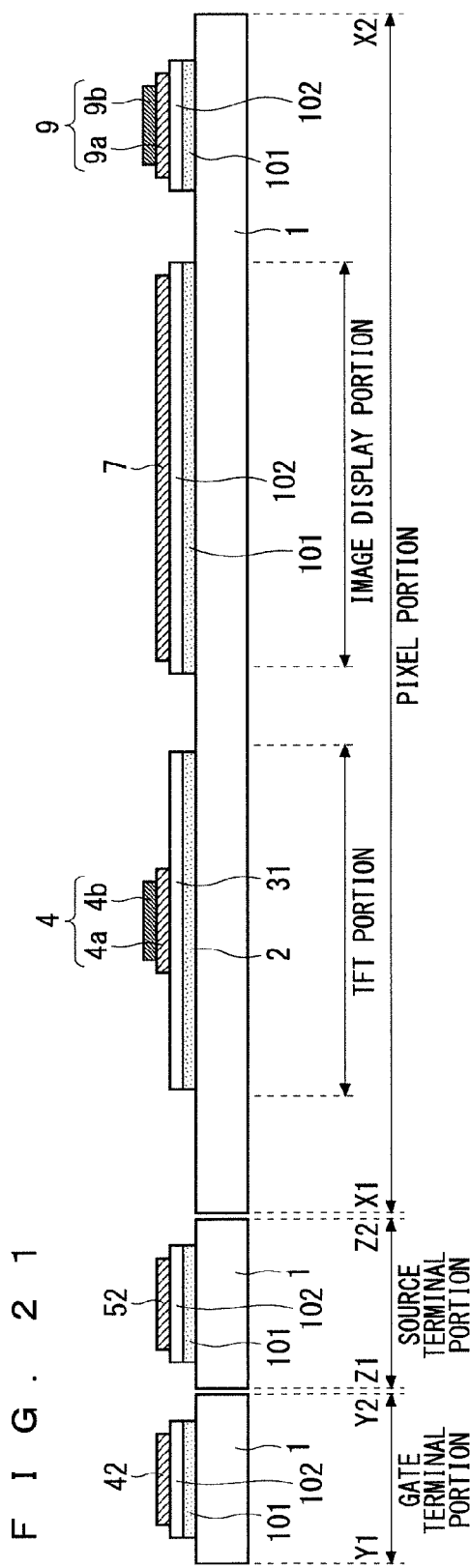

Subsequently, the third photoresist portions 113 are separated and removed with a photoresist removing liquid of an amine. As a result, as shown in FIGS. 13 and 21, the semiconductor channel film 2, the gate insulating film 31, the gate electrode 4, the gate wires 41, the pixel electrode 7, the common electrode 9, the common wires 91, the gate terminal 42, and the source terminal 52 are formed.

In this manner, with the use of the half-tone technique, the only one photolithography step can thus form the semiconductor channel film 2 formed of the semiconductor film 101, the gate insulating film 31 formed of the first insulating film 102, the pixel electrode 7, the gate terminal 42, the source terminal 52, the gate electrode 4, the gate wires 41, the common electrode 9, and the common wires 91. The pixel electrode 7, the gate terminal 42, and the source terminal 52 are formed of the first conductive film 103. The gate electrode 4, the gate wires 41, the common electrode 9, and the common wires 91 are formed of the laminated structure including the first conductive film 103 and the second conductive film 104.

However, the laminated film including the semiconductor film 101, the first insulating film 102, the first conductive film 103, and the second conductive film 104 is needed to be patterned, so that the semiconductor film 101 and the first insulating film 102 cannot be removed from under the components formed of the first conductive film 103 or the second conductive film 104. Thus, the semiconductor film 101 and the first insulating film 102 are configured to remain under the gate wires 41, the pixel electrode 7, the common electrode 9, the common wires 91, the gate terminal 42, and the source terminal 52.

In this preferred embodiment, the first insulating film 102 and the semiconductor film 101 are respectively formed of the light-transmissive SiO film and InGaZnO film, so that even if the first insulating film 102 and the semiconductor film 101 remain under the pixel electrode 7, the light-transmissive properties of the image display portion are highly maintained.

Figure 23:
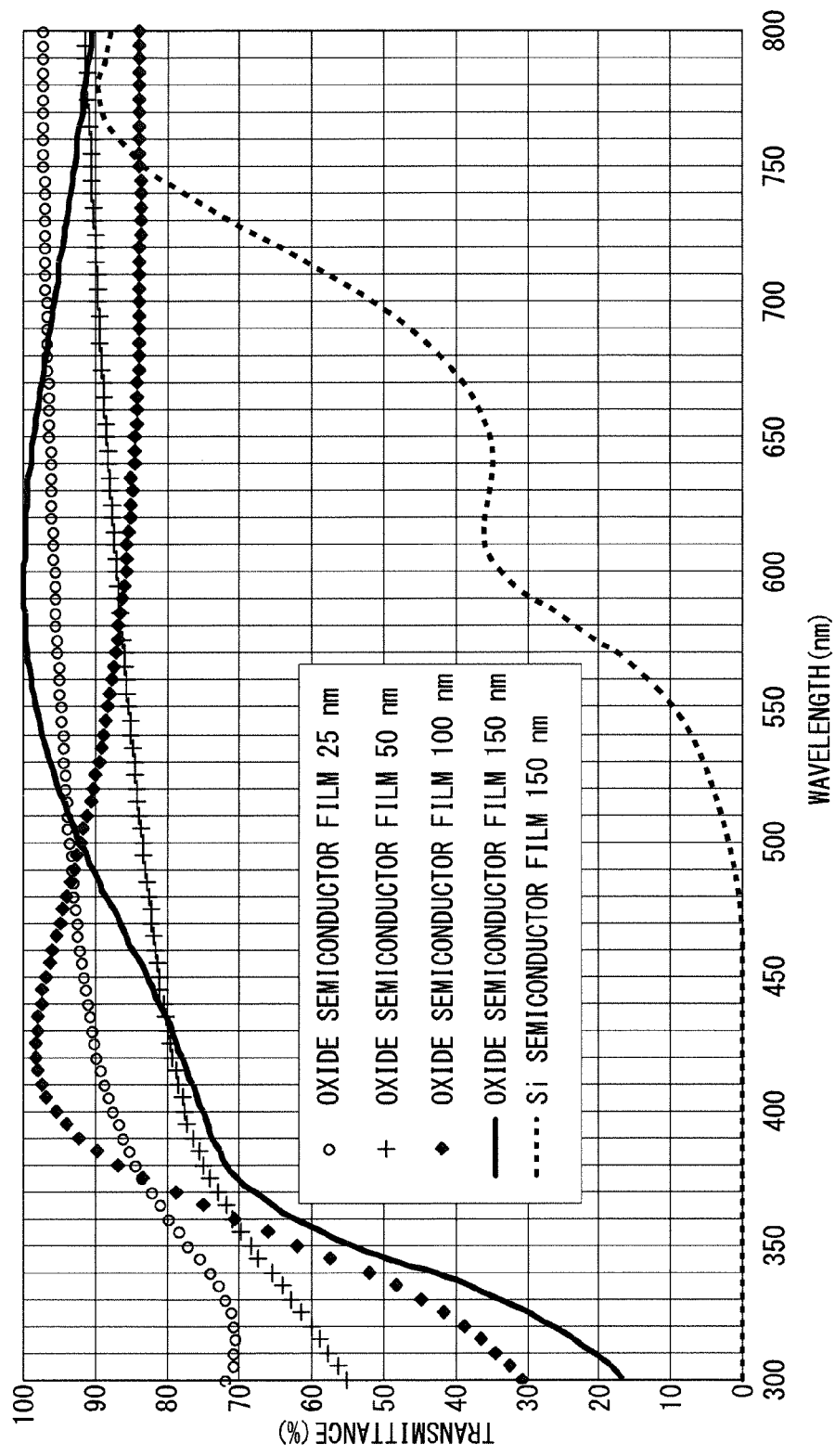
FIG. 23 is a diagram showing spectral characteristics of a transmittance of semiconductor films used in the TFT substrate according to the second preferred embodiment.

FIG. 23 is a diagram showing a result of measuring spectral characteristics of a transmittance of the oxide semiconductor film (InGaZnO film) used as the semiconductor film 101. The transmittance of light decreases as a film thickness increases in principle (with the need for considering an interference effect of light). In a visible light wavelength region (400 to 800 nm), it is clear that the InGaZnO film has the high transmittance of greater than or equal to 70% required for a transmissive electrode up to the film thickness of at least 150 nm, which includes the film thickness of 50 nm used in the second preferred embodiment.

On the other hand, the semiconductor film 101 is also a material for the semiconductor channel film 2 of the TFT 201. If the semiconductor channel film 2 has the thickness of less than 20 nm, the semiconductor channel film 2 fails to function properly, so that the film thickness is preferably at least greater than or equal to 20 nm Thus, the semiconductor film 101 preferably has the thickness of greater than or equal to 20 nm and less than or equal to 150 nm in consideration of both the function of the semiconductor channel film 2 and the light-transmissive properties of the image display portion.

FIG. 23 also shows the result of measuring the spectral properties of the transmittance of the conventional Si semiconductor film having the thickness of 150 nm The Si semiconductor film has the low transmittance, so that if the Si semiconductor film is applied to the semiconductor film 101 of the preferred embodiment, the light transmittance of the image display portion decreases. Thus, it can be said that the Si semiconductor film is hardly applied to the semiconductor film 101 in the transmissive TFT substrate 200 according to the preferred embodiment.

In the preferred embodiment, the first conductive film 103 (ITO film) and the second conductive film 104 (Al-3 mol % Ni film) are etched with the chemical solution of the oxalic acid and the acid chemical solution of the PAN, respectively. Upon the etching step, the gate insulating film 31 formed of the first insulating film 102 (SiO film) covers the semiconductor channel film 2 (InGaZnO film) for protection. This prevents the semiconductor channel film 2 from being etched, thereby being kept in an excellent pattern shape.

Moreover, the first insulating film 102 forming the gate insulating film 31 has the single-layer structure including the SiO film here, and the first insulating film 102 may have the laminated structure further including the insulating film provided on the SiO film. The upper layer of the insulating film may be the SiO film and may also be the insulating film formed of the other material such as silicon nitride (SiN). It should be noted that the first insulating film 102 is configured to be located under the pixel electrode 7, so that in a case of the transmissive TFT substrate 200, the upper layer of the insulating film is needed to have the light-transmissive properties. The first insulating film has the laminated structure, allowing for the greater coverage as a protective film.

The step after forming the semiconductor channel film 2, the gate insulating film 31, the gate electrode 4, the gate wires 41, the pixel electrode 7, the common electrode 9, the common wires 91, the gate terminal 42, and the source terminal 52 is similar to that of the first preferred embodiment. The first preferred embodiment requires the two photolithography steps of forming each component mentioned above. In this preferred embodiment, the photolithography step has been performed only once, which reduces one photolithography step.

Figure 22:
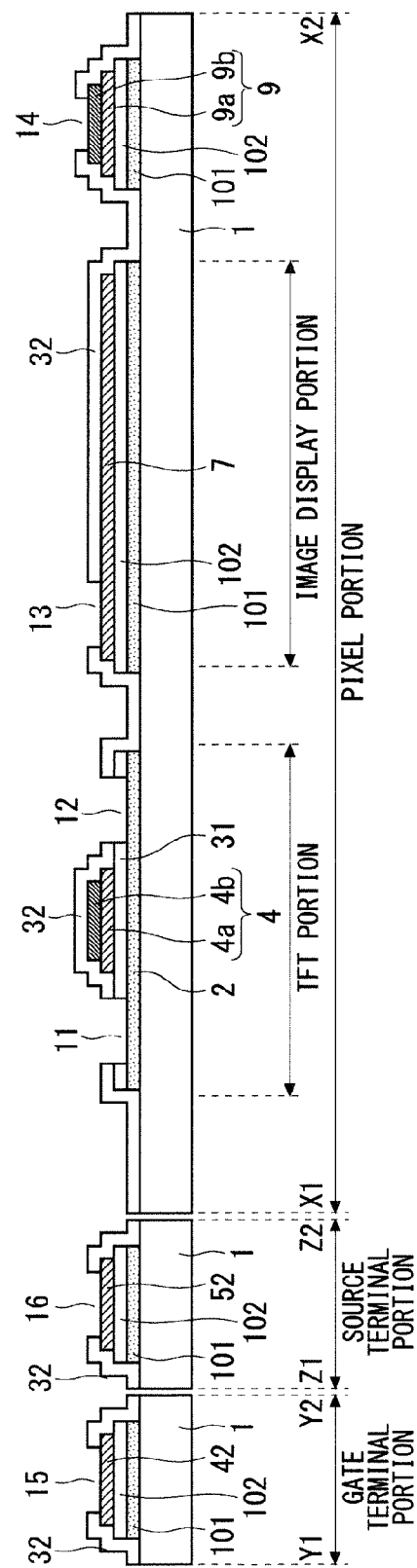

In other words, the second insulating film is formed entirely on the substrate 1 so as to cover the semiconductor channel film 2, the gate insulating film 31, the gate electrode 4, the gate wires 41, the pixel electrode 7, the common electrode 9, the common wires 91, the gate terminal 42, and the source terminal 52, to thereby form the interlayer insulating film 32. Then, the second photolithography step forms a photoresist pattern, and the contact holes 11 to 16 are formed in the interlayer insulating film 32 and the gate insulating film 31 by etching with the photoresist pattern as a mask, as shown in FIGS. 14 and 22.

Next, a laminated film including the third conductive film and the fourth conductive film laminated in the stated order is formed on the interlayer insulating film 32. The third photolithography step forms a photoresist pattern, and the third conductive film and the fourth conductive film are patterned by etching with the photoresist pattern as a mask, to thereby form the source electrode 5, the source wires 51, the drain electrode 6, the counter electrode 8, the gate terminal pad 43, and the source terminal pad 53. The half-tone exposure technique is also applied in this step, and thus the fourth conductive film is removed from each region for forming the drain electrode 6, the counter electrode 8, the gate terminal pad 43, and the source terminal pad 53 while the fourth conductive film remains in each region for forming the source electrode 5 and the source wires 51.

As a result, the source electrode 5, the source wires 51, the drain electrode 6, the counter electrode 8, the gate terminal pad 43, and the source terminal pad 53 are formed, to thereby form the TFT substrate 200 having the configuration shown in FIGS. 11 and 12. The half-tone exposure technique allows the source electrode 5 and the source wires 51 to have the laminated structure including the third conductive film and the fourth conductive film, and the half-tone exposure technique allows the drain electrode 6, the counter electrode 8, the gate terminal pad 43, and the source terminal pad 53 to have the single-layer structure including the third conductive film.

In this manner, the TFT substrate 200 of the second preferred embodiment can be formed in the three photolithography steps with great productivity.

Upon assembly of the liquid crystal display panel, the TFT substrate 200 that has been completed includes the alignment film and the spacers formed on the surface thereof and includes the counter substrate that has been formed separately bonded thereon. The liquid crystals are injected into the gap in which the spacers create between the TFT substrate 200 and the counter substrate and are sealed, to thereby form the liquid crystal display panel. In the end, the polarizing plate, the phase difference plate, and the backlight unit are disposed on the outer side of the liquid crystal display panel, to thereby complete the LCD of the FFS mode.

In the TFT substrate 200 of the first preferred embodiment, the semiconductor channel film 2 of the TFT 201 is disposed in the lowest layer, so that the light from the backlight unit is directly incident on the semiconductor channel film 2. In a case where the semiconductor channel film 2 is the Si film, ON/OFF ratio, which is one of TFT characteristics, may degrade due to photocarrier generation, but the degradation in the ON/OFF ratio can be suppressed if the semiconductor channel film 2 is made of the oxide semiconductor as in this preferred embodiment. Therefore, the liquid crystal display device having a high contrast ratio and a high display quality without display unevenness can be realized.

Moreover, the semiconductor channel film 2 made of the oxide semiconductor allows for a high mobility of the TFT 201, whereby the TFT substrate 200 with high operation speed can be obtained. Therefore, the TFT can be reduced in size, and the aperture ratio of the image display portion can be increased. In other words, a display at high luminance is possible even with the reduced emitting light from the backlight unit, which can realize the LCD with reduced power consumption.

Modification of Second Preferred Embodiment

Figure 24:
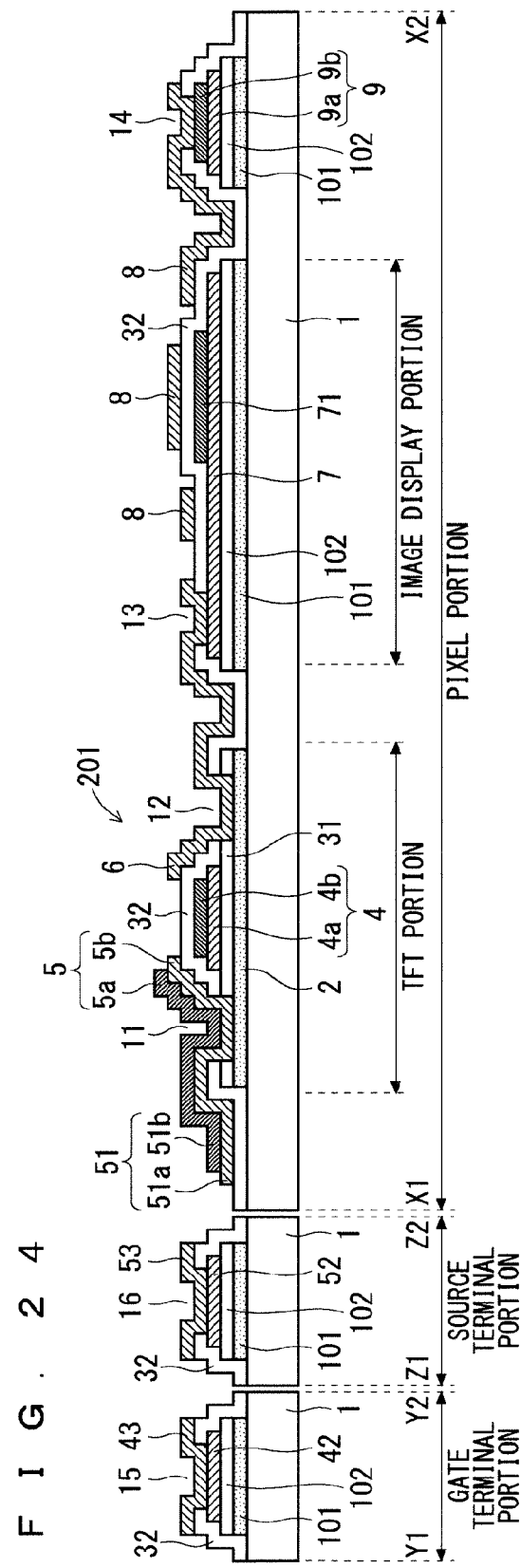
FIG. 24 is a cross-sectional view showing a TFT substrate according to a modification of the second preferred embodiment.

FIG. 24 is a cross-sectional view showing a TFT substrate 200 according to a modification of the second preferred embodiment. The first preferred embodiment described above exemplifies the transmissive TFT substrate 200 in which the light passes through the whole pixel electrode 7. As shown in FIG. 24, a reflective pixel electrode 71 that reflects light is provided in a fixed area on the pixel electrode 7, whereby the semi-transmissive TFT substrate 200 can also be manufactured.

The reflective pixel electrode 71 is formed of the second conductive film 104 (metal film such as the Al-3 mol % Ni film), so that a manufacturing step is not increased. In other words, in the half-tone exposure (FIG. 16) of the first photolithography step, the light-shielding region T3 may be provided on a portion corresponding to the region for forming the reflective pixel electrode 71. Consequently, the thick third photoresist portion 113 is formed in the region, whereby the first conductive film 103 serving as the reflective pixel electrode 71 can remain on the corresponding portion of the pixel electrode 7.

Changing the area or the shape of the pattern of the reflective pixel electrode 71 formed on the pixel electrode 7 can arbitrarily set the ratio of the transmitted light and the reflected light of the semi-transmissive electrode. Moreover, if the reflective pixel electrode 71 is formed on almost the entire surface of the pixel electrode 7, the full reflective TFT substrate 200 can be manufactured.

Third Preferred Embodiment

Figure 25:
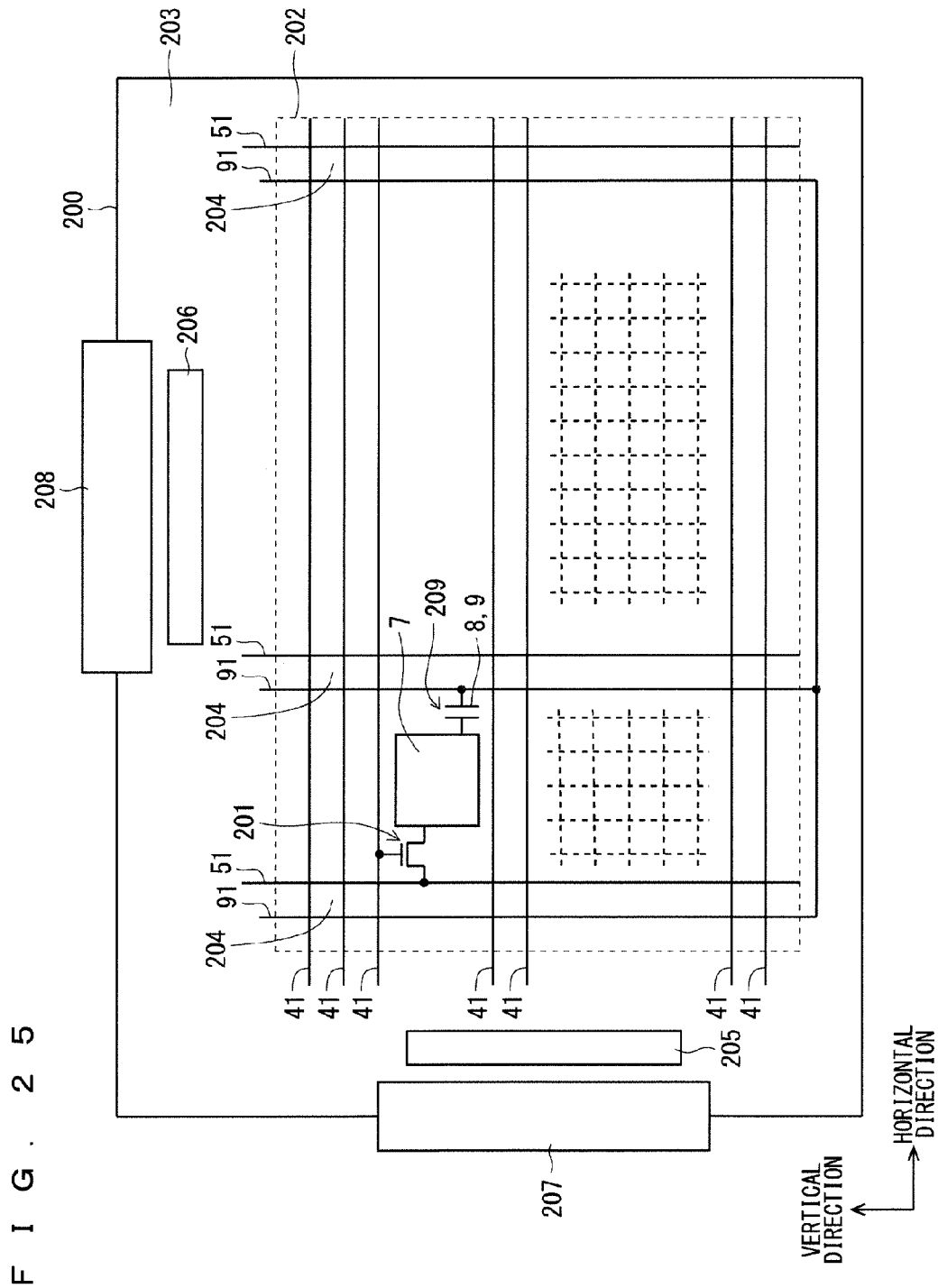
FIG. 25 is a plan view showing a configuration of a TFT substrate according to a third preferred embodiment.

FIG. 25 is a plan view showing a configuration of a TFT substrate according to a third preferred embodiment. In the TFT substrate (FIG. 1) of the first and second preferred embodiments, the common wires 91 that supply the counter electrode 8 with the common voltage extend in parallel to the gate wires 41. In the third preferred embodiment, the common wires 91 extend in parallel to the source wires 51.

Figure 26:
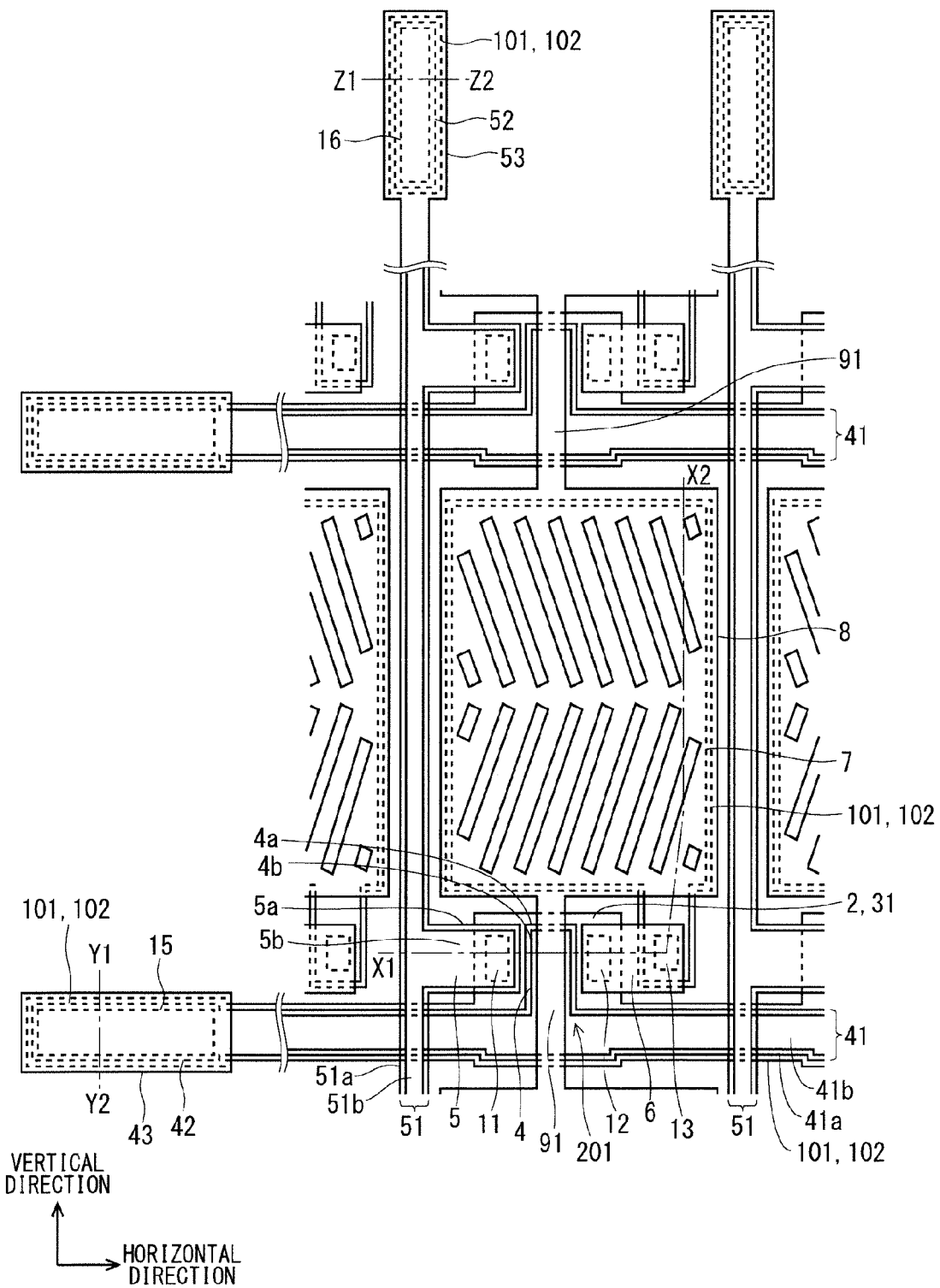
FIG. 26 is a plan view of the TFT substrate according to the third preferred embodiment.
Figure 27:
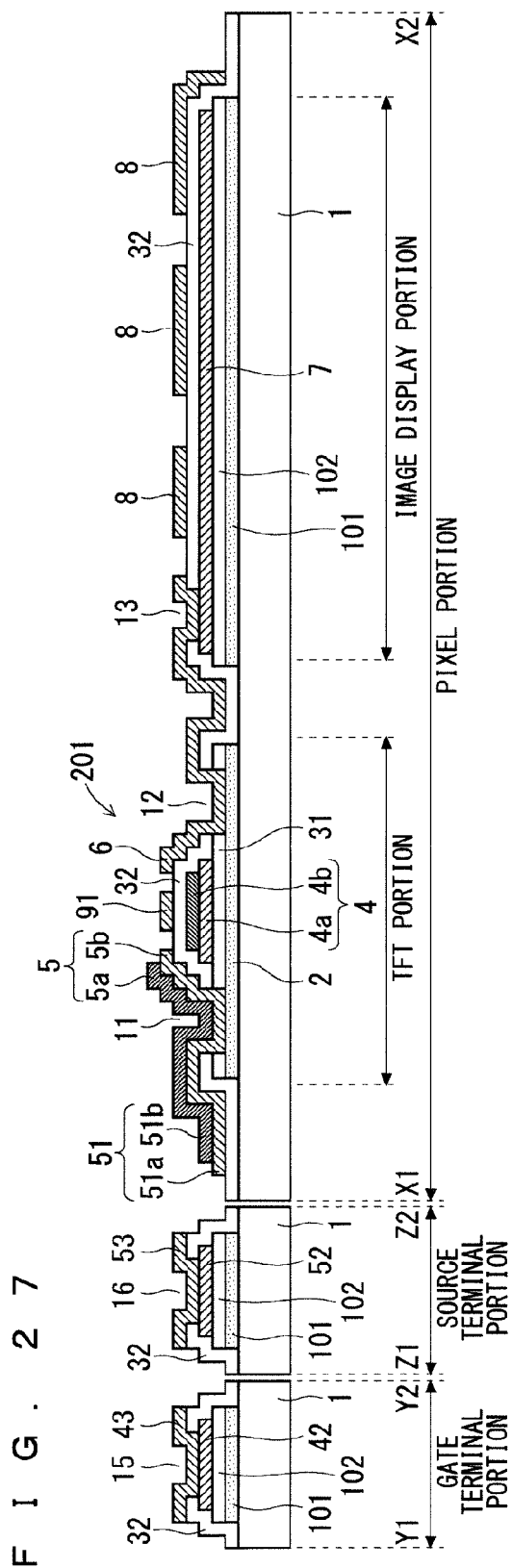
FIG. 27 is a cross-sectional view of the TFT substrate according to the third preferred embodiment.

FIG. 26 is a diagram showing a planar configuration of a main part including the pixel 204 in the TFT substrate 200 according to the third preferred embodiment, and FIG. 27 is a diagram showing a cross-sectional configuration thereof. FIG. 27 shows corresponding cross sections taken along an X1-X2 line, a Y1-Y2 line, and a Z1-Z2 line shown in FIG. 26. In FIGS. 26 and 27, the components having the same functions as those described in the first and second preferred embodiments (FIGS. 2, 3, 11, and 12) are denoted by the same references, which are not described here. The TFT substrate 200 has the whole configuration similar to that in the first preferred embodiment (FIG. 1).

The cross section taken along the X1-X2 line in FIG. 27 corresponds to the region (pixel portion) for forming the pixel 204 and includes the "TFT portion" that is the region for forming the TFT 201 and the "image display portion" that is the region for forming the pixel electrode 7 and the counter electrode 8. The cross section taken along the Y1-Y2 line corresponds to the region (gate terminal portion) for forming the gate terminal 42 and the gate terminal pad 43, and the cross section taken along the Z1-Z2 line corresponds to the region (source terminal portion) for forming the source terminal 52 and the source terminal pad 53.

As seen from FIGS. 26 and 27, the TFT substrate 200 of the third preferred embodiment has the laminated structure including the semiconductor film 101 in the same layer as the semiconductor channel film 2 and the first insulating film 102 in the same layer as the gate insulating film 31 also formed under each of the components formed of the first conductive film 103 or the second conductive film 104, namely, under the gate wires 41, the pixel electrode 7, the gate terminal 42, and the source terminal 52.

Moreover, the common wires 91 that supply the counter electrode 8 with the common voltage are integrally formed with the counter electrode 8 using the third conductive film and are also connected to the counter electrode 8 in the adjacent pixel in the vertical direction (extending direction of the source wires 51) of FIG. 26 across the gate wires 41. In other words, the counter electrodes 8 each in the pixels are coupled in the vertical direction through the common wires 91. That is to say, the counter electrode 8 functions as part of the common wires 91.

In such manner, the common wires 91 are formed in the layer different from the layer of the pixel electrode 7, so that the pixel electrode 7 can be formed in almost the entire region of the pixel portion. The common wires 91 are integrally formed with the counter electrode 8, which eliminates the need to provide the common wires 91 used to connect the counter electrode 8 to the common electrode 9 and also eliminates the need for the contact hole 14 (common electrode contact hole) for the connection.

Figure 28:
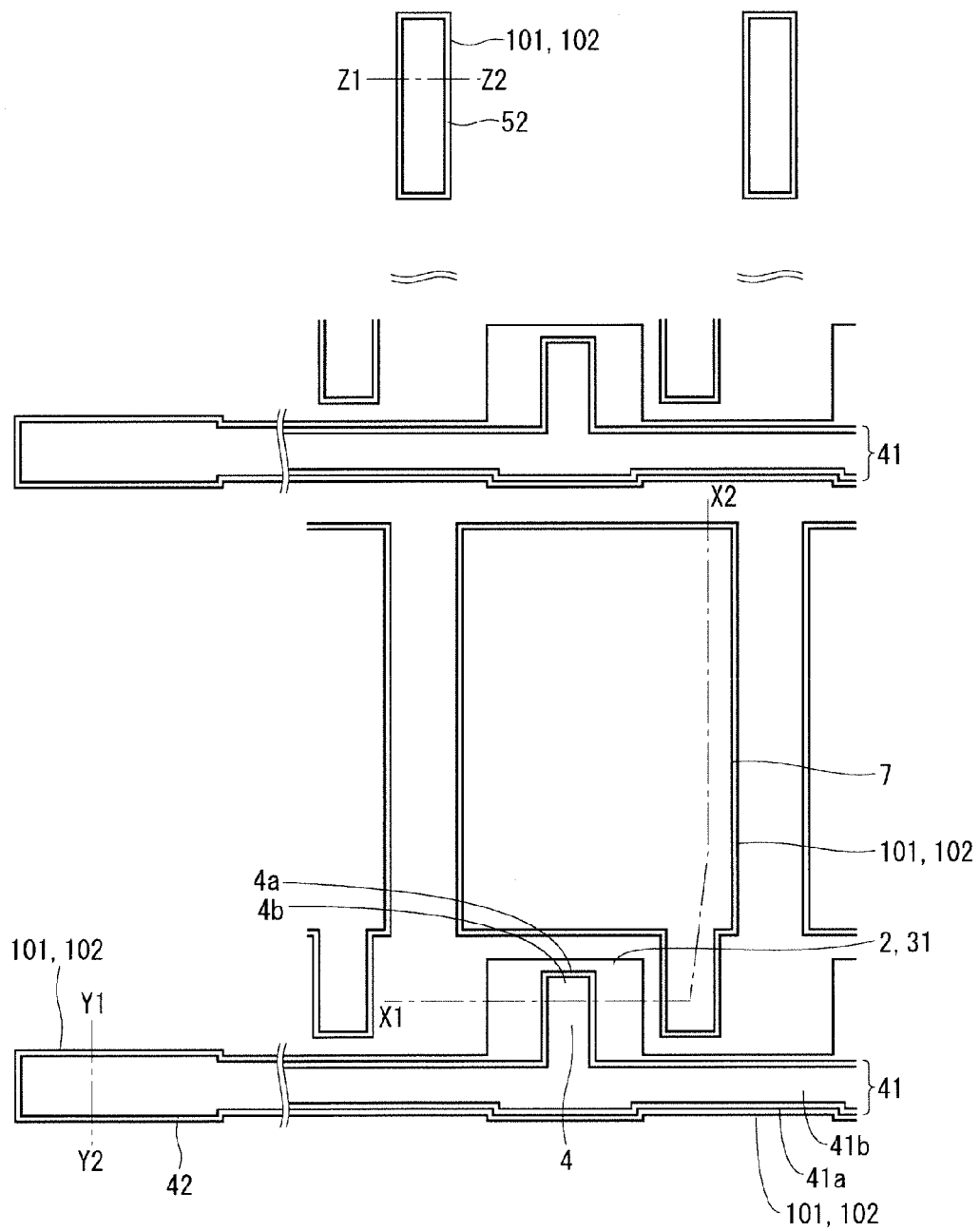
FIGS. 28 and 29 are process diagrams in plan view showing a method for manufacturing the TFT substrate according to the third preferred embodiment.
Figure 29:
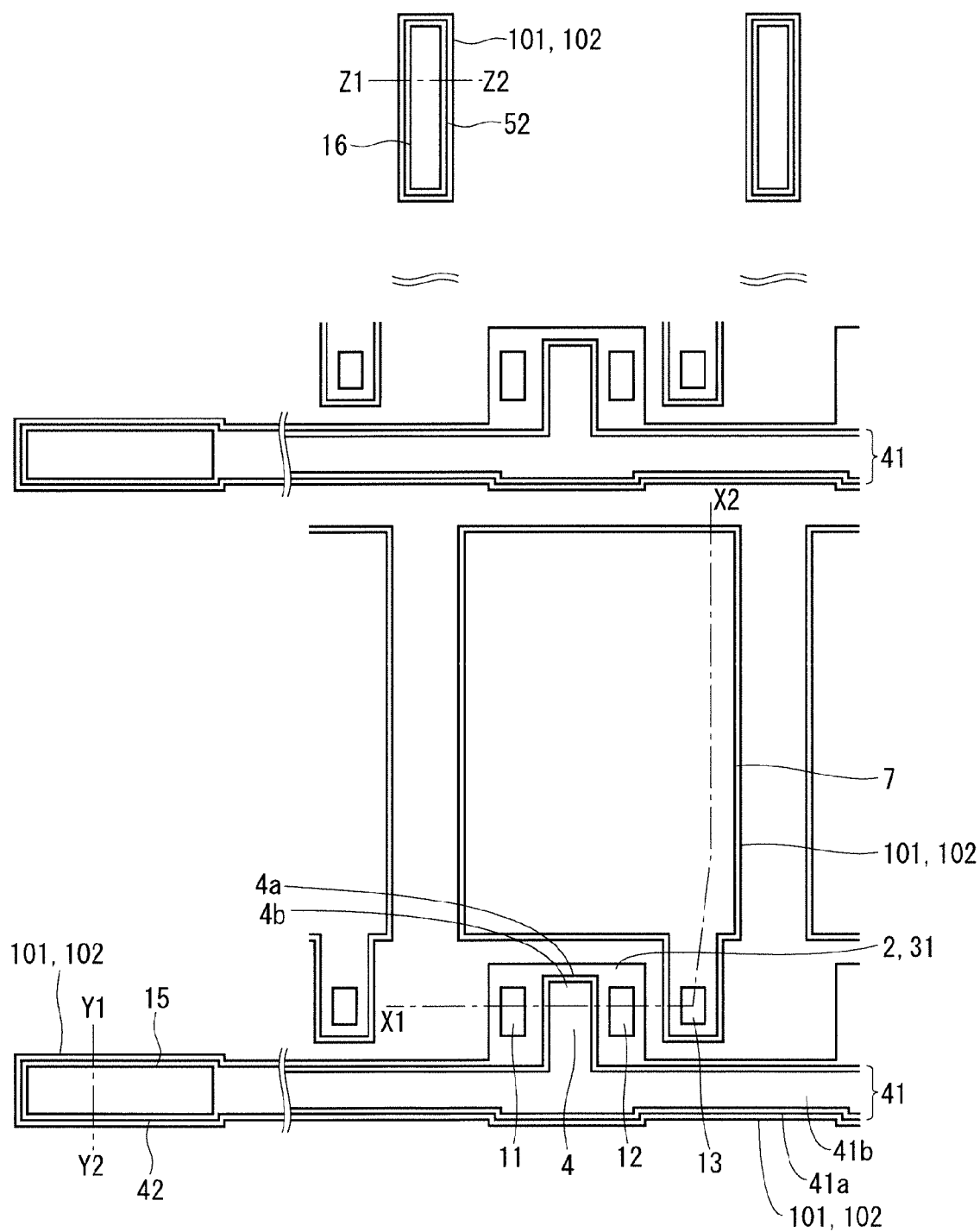
Figure 30:
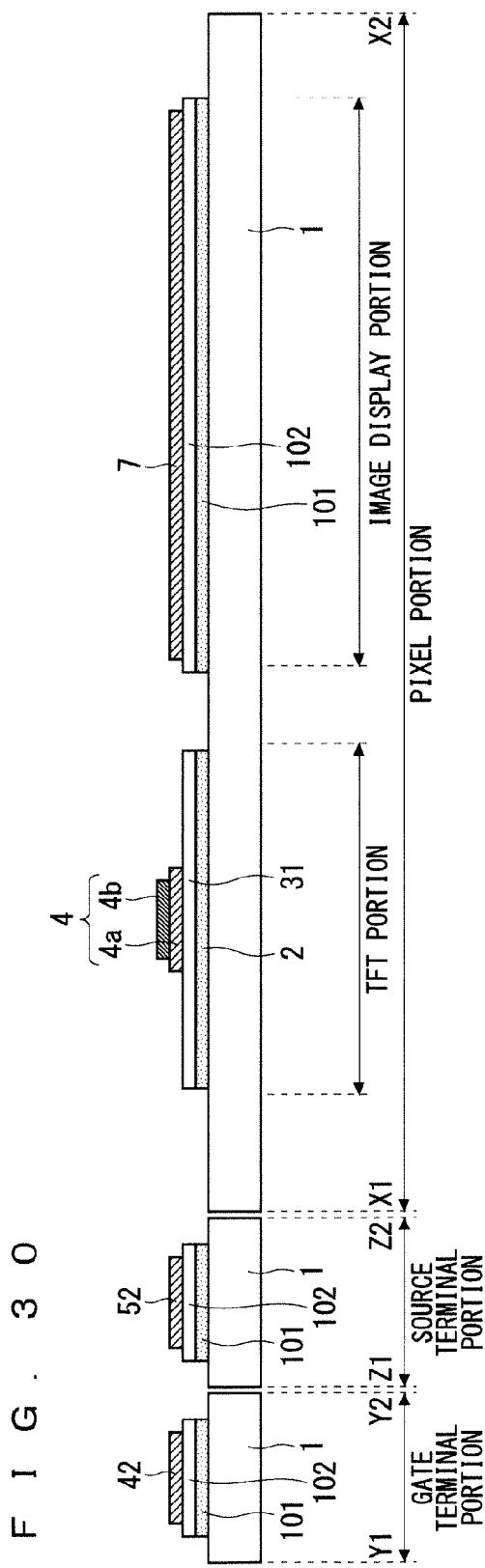
FIGS. 30 and 31 are process diagrams in cross section showing the method for manufacturing the TFT substrate according to the third preferred embodiment.
Figure 31:
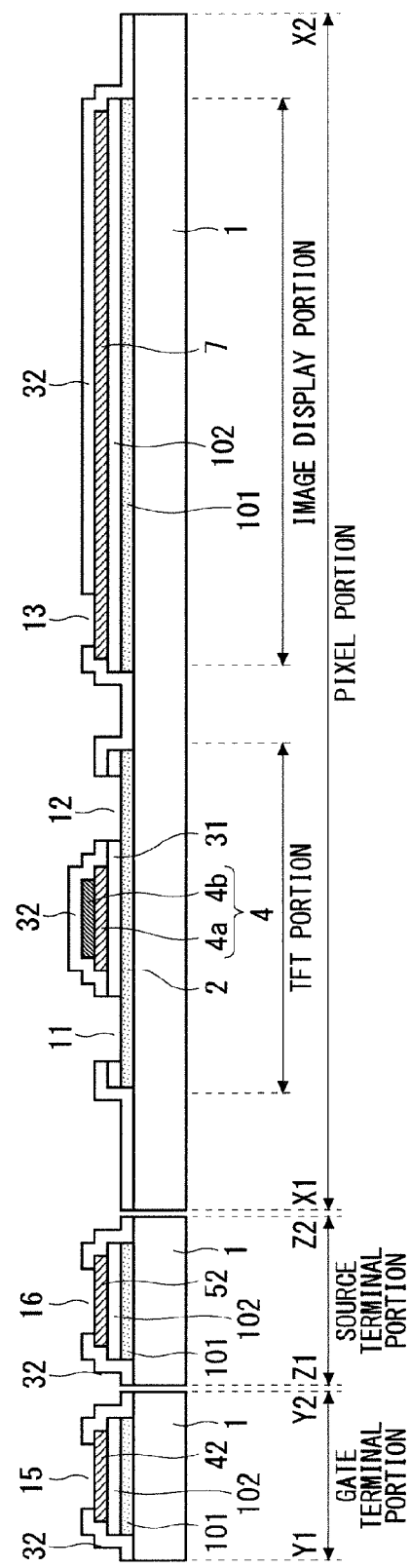

Next, a method for manufacturing the TFT substrate 200 according to the third preferred embodiment will be described with reference to FIGS. 28 to 31. FIGS. 28 and 29 are process diagrams in plan view showing each step of the method for manufacturing the TFT substrate 200, and FIGS. 30 and 31 are process diagrams in cross section showing each step of the method for manufacturing the TFT substrate 200. FIGS. 28 and 29 are plan views corresponding to FIGS. 30 and 31, respectively. In these diagrams, components corresponding to those shown in FIGS. 26 and 27 are denoted by the same references.

First, the surface of the substrate 1 is cleaned with cleaning liquid or pure water. A laminated film including the semiconductor film 101 being the material for the semiconductor channel film 2, the first insulating film 102 being the material for the gate insulating film 31, and the first conductive film 103 and the second conductive film 104 being the materials for the gate electrode 4 and the pixel electrode 7 laminated in the stated order is formed on the substrate 1 that has been cleaned.

Also in this preferred embodiment similar to the first preferred embodiment, the InGaZnO film being the oxide semiconductor, the silicon oxide (SiO) film, the light-transmissive ITO film, and the Al-3 mol % Ni film being the aluminum (Al) alloy are used for the semiconductor film 101, the first insulating film 102, the first conductive film 103, and the second conductive film 104, respectively. In addition, their thicknesses and the method for forming them may be the same as those in the first preferred embodiment.

Subsequently, the same method described with reference to FIGS. 15 to 21 in the second preferred embodiment, namely, the first photolithography step using the half-tone exposure technique forms a photoresist pattern. Then, a method that repeats etching with the photoresist pattern as a mask and ashing (thickness reduction) of the photoresist pattern patterns the above-mentioned laminated film, to thereby form the semiconductor channel film 2, the gate insulating film 31, the gate electrode 4, the gate wires 41, the pixel electrode 7, the gate terminal 42, and the source terminal 52 as shown in FIGS. 28 and 30. The gate electrode 4 and the gate wires 41 have the laminated structure including the first conductive film 103 and the second conductive film 104, and the pixel electrode 7, the gate terminal 42, and the source terminal 52 have the single-layer structure including the first conductive film 103. Moreover, the semiconductor film 101 and semiconductor film 102 remain under the gate wires 41, the pixel electrode 7, the gate terminal 42, and the source terminal 52.

The following step is almost the same as that of the second preferred embodiment. It should be noted that when the source electrode 5, the drain electrode 6, the counter electrode 8, or the like is formed using the third conductive film, the common wires 91 are needed to be integrally formed with the counter electrode 8. Moreover, the contact hole 14 (common electrode contact hole) is not formed.

In other words, the second insulating film is formed entirely on the substrate 1 so as to cover the semiconductor channel film 2, the gate insulating film 31, the gate electrode 4, the gate wires 41, the pixel electrode 7, the gate terminal 42, and the source terminal 52 after the formation thereof, to thereby form the interlayer insulating film 32. Then, the second photolithography step forms a photoresist pattern, and etching with the photoresist pattern as a mask forms the contact hole 11, the contact hole 12, the contact hole 13, the contact hole 15, and the contact hole 16 in the interlayer insulating film 32 and the gate insulating film 31, as shown in FIGS. 29 and 31.

Next, a laminated film including the third conductive film and the fourth conductive film laminated in the stated order is formed on the interlayer insulating film 32, the third photolithography step forms a photoresist pattern, and the third conductive film and the fourth conductive film are patterned by etching with the photoresist pattern as a mask, to thereby form the source electrode 5, the source wires 51, the drain electrode 6, the counter electrode 8, the common wires 91, the gate terminal pad 43, and the source terminal pad 53. The half-tone exposure technique is also applied in this step, and thus the fourth conductive film is removed from each region for forming the drain electrode 6, the counter electrode 8, the common wires 91, the gate terminal pad 43, and the source terminal pad 53 while the fourth conductive film remains in each region for forming the source electrode 5 and the source wires 51. In other words, the source electrode 5 and the source wires 51 have the laminated structure including the third conductive film and the fourth conductive film while the drain electrode 6, the counter electrode 8, the common wires 91, the gate terminal pad 43, and the source terminal pad 53 have the single-layer structure including the third conductive film.

As a result, the TFT substrate 200 having the configuration shown in FIGS. 26 and 27 is formed. In this manner, the TFT substrate 200 of the third preferred embodiment can be formed in the three photolithography steps with great productivity.

Upon assembly of the liquid crystal display panel, the TFT substrate 200 that has been completed includes the alignment film and the spacers formed on the surface thereof and includes the counter substrate that has been formed separately bonded thereon. The liquid crystals are injected into the gap in which the spacers create between the TFT substrate 200 and the counter substrate and are sealed, to thereby form the liquid crystal display panel. In the end, the polarizing plate, the phase difference plate, and the backlight unit are disposed on the outer side of the liquid crystal display panel, to thereby complete the LCD of the FFS mode.

The TFT substrate 200 according to the third preferred embodiment can also obtain the effects similar to those of the first and second preferred embodiments. The counter electrodes 8 each in pixels are coupled to function as part of the common wires 91, which eliminates the need to provide the common wires 91 in the lower layer (the same layer as the pixel electrode 7) unlike the first and second preferred embodiments. Thus, the pixel electrode 7 is formed in almost the entire region of the pixel portion, whereby the area of the image display portion can be increased. Consequently, the LCD of the FFS mode that is brighter and has a high display quality can be realized. This enables a display at high luminance even with the reduced emitting light from the backlight unit, which can also contribute to a reduction in power consumption.

Modification of Third Preferred Embodiment

Figure 32:
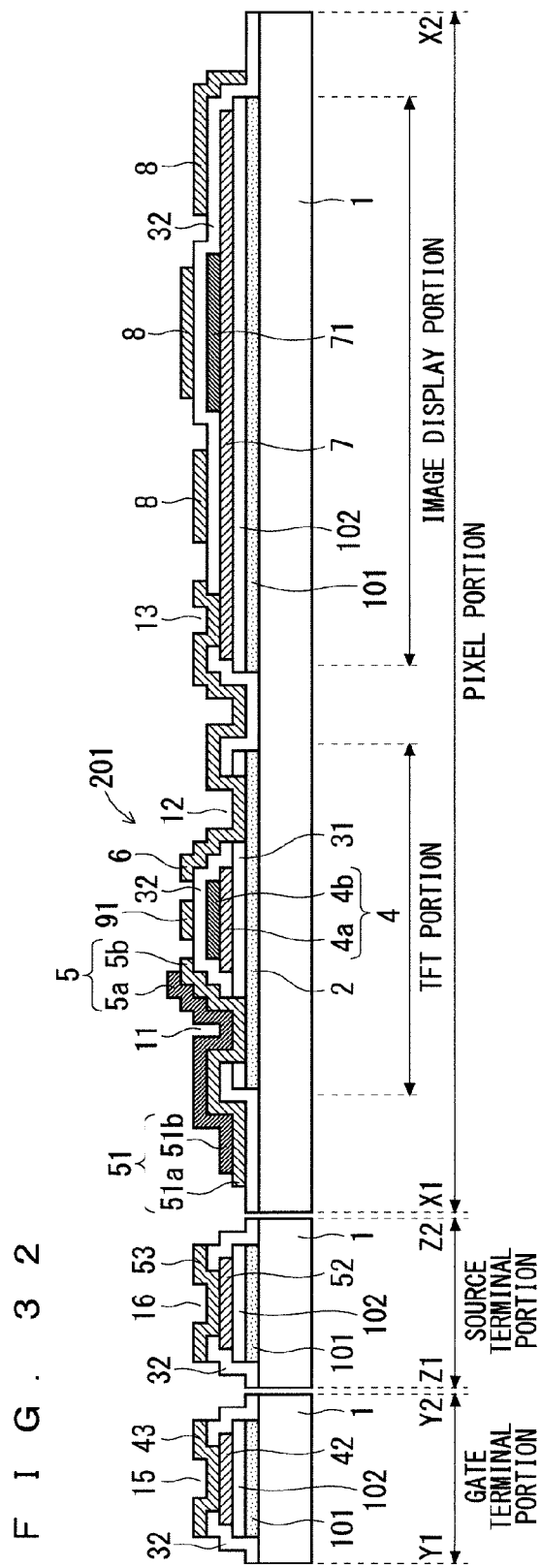
FIG. 32 is a cross-sectional view showing a TFT substrate according to a modification of the third preferred embodiment.

FIG. 32 is a cross-sectional view showing a TFT substrate 200 according to a modification of the third preferred embodiment. As shown in FIG. 32, the TFT substrate 200 of the third preferred embodiment includes the reflective pixel electrode 71 that reflects light provided in a fixed area on the pixel electrode 7, whereby the semi-transmissive TFT substrate 200 can also be manufactured.

The reflective pixel electrode 71 is formed of the second conductive film 104 (metal film such as the Al-3 mol % Ni film), so that a manufacturing step is not increased. In other words, in the half-tone exposure of the first photolithography step, the light-shielding region T3 may be provided on a portion corresponding to the region for forming the reflective pixel electrode 71. Consequently, the thick third photoresist portion 113 is formed in the region, whereby the first conductive film 103 serving as the reflective pixel electrode 71 can remain on the corresponding portion of the pixel electrode 7.

Changing the area or the shape of the pattern of the reflective pixel electrode 71 formed on the pixel electrode 7 can arbitrarily set the ratio of the transmitted light and the reflected light of the semi-transmissive electrode. Moreover, if the reflective pixel electrode 71 is formed on almost the entire surface of the pixel electrode 7, the full reflective TFT substrate 200 can be manufactured.

Fourth Preferred Embodiment

Figure 33:
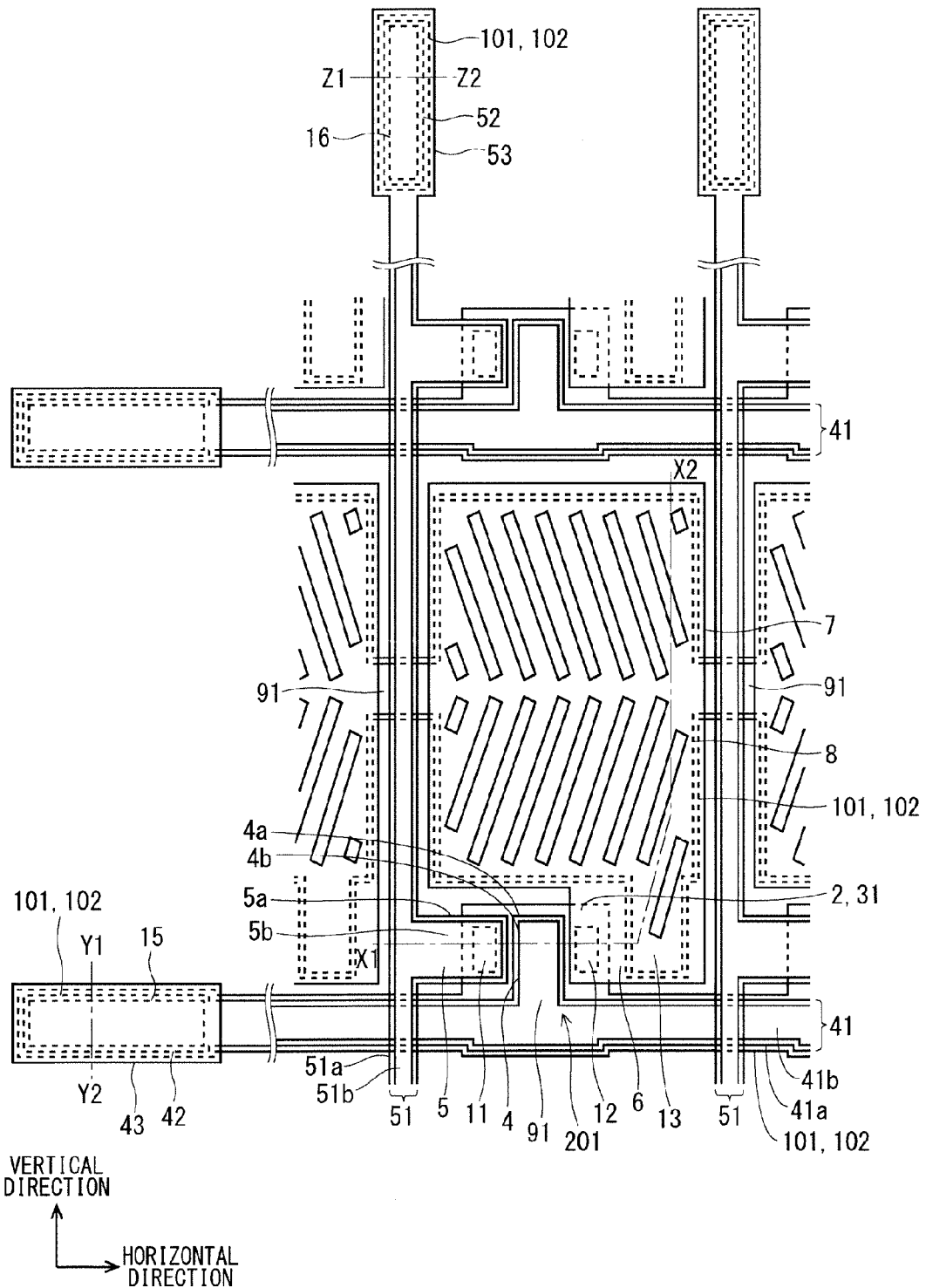
FIG. 33 is a plan view of a TFT substrate according to the fourth preferred embodiment.
Figure 34:
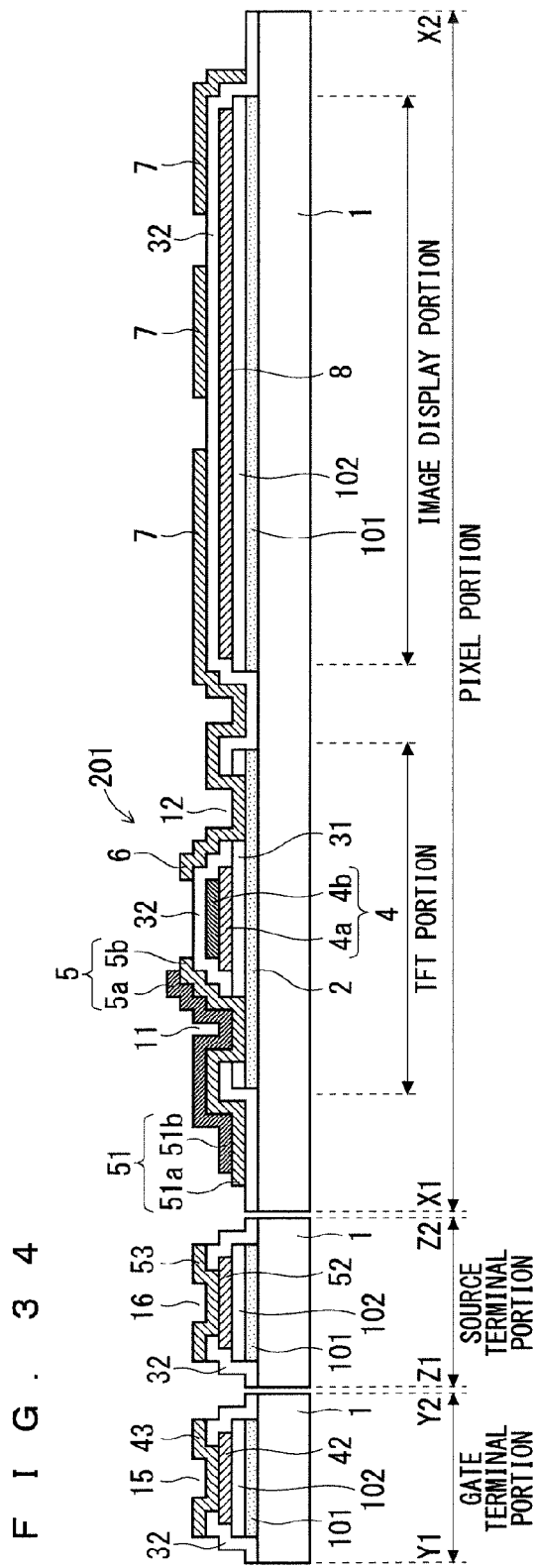
FIG. 34 is a cross-sectional view of the TFT substrate according to the fourth preferred embodiment.

FIG. 33 is a diagram showing a planar configuration of a main part including the pixel 204 in a TFT substrate 200 according to a fourth preferred embodiment, and FIG. 34 is a diagram showing a cross-sectional configuration thereof. FIG. 34 shows corresponding cross sections taken along an X1-X2 line, a Y1-Y2 line, and a Z1-Z2 line shown in FIG. 33. The TFT substrate 200 has the whole configuration similar to that in the first preferred embodiment (FIG. 1).

The cross section taken along the X1-X2 line in FIG. 34 corresponds to the region (pixel portion) for forming the pixel 204 and includes the "TFT portion" that is the region for forming the TFT 201 and the "image display portion" that is the region for forming the pixel electrode 7 and the counter electrode 8. The cross section taken along the Y1-Y2 line corresponds to the region (gate terminal portion) for forming the gate terminal 42 and the gate terminal pad 43, and the cross section taken along the Z1-Z2 line corresponds to the region (source terminal portion) for forming the source terminal 52 and the source terminal pad 53.

In FIGS. 33 and 34, the components having the same functions as those described in the first and second preferred embodiments (FIGS. 2, 3, 11, and 12) are denoted by the same references, which are not described here.

The configuration of the TFT substrate 200 of the fourth preferred embodiment is similar to that of the second preferred embodiment (FIGS. 11 and 12), but the pixel electrode 7 and the counter electrode 8 have the configurations and positions opposite to those in the second preferred embodiment. In other words, the counter electrode 8 is a flat plate-shaped electrode formed of the first conductive film, and the pixel electrode 7 has a grid pattern formed of the third conductive film. The pixel electrode 7 is disposed on the counter electrode 8 to face the counter electrode 8 through the interlayer insulating film 32.

The common wires 91 that supply the counter electrode 8 with the common voltage are integrally formed with the counter electrode 8 using the first conductive film and are also connected to the counter electrode 8 in the adjacent pixel in the horizontal direction (extending direction of the gate wires 41) of FIG. 33, the common wires 91 passing under the source wires 51. In other words, the counter electrodes 8 each in the pixels are coupled in the horizontal direction through the common wires 91. That is to say, the counter electrode 8 functions as part of the common wires 91.

In such manner that the counter electrode 8 is used as part of the common wires 91, the counter electrode 8 can be formed in almost the entire region of the pixel portion. The common wires 91 are integrally formed with the counter electrode 8, which eliminates the need to provide the common wires 91 used to connect the counter electrode 8 to the common electrode 9 and also eliminates the need for the contact hole 14 (common electrode contact hole) for the connection.

Meanwhile, the pixel electrode 7 is integrally formed with the drain electrode 6 also formed of the third conductive film. This also eliminates the need for the contact hole 13 (pixel electrode contact hole) for connecting the pixel electrode 7 to the drain electrode 6.

The TFT substrate 200 of the fourth preferred embodiment similar to the second preferred embodiment (FIGS. 11 and 12) has the laminated structure including the semiconductor film 101 in the same layer as the semiconductor channel film 2 and the first insulating film 102 in the same layer as the gate insulating film 31 also formed under each of the components formed of the first conductive film 103 or the second conductive film 104, namely, under the gate wires 41, the counter electrode 8, the common wires 91, the gate terminal 42, and the source terminal 52.

Figure 35:
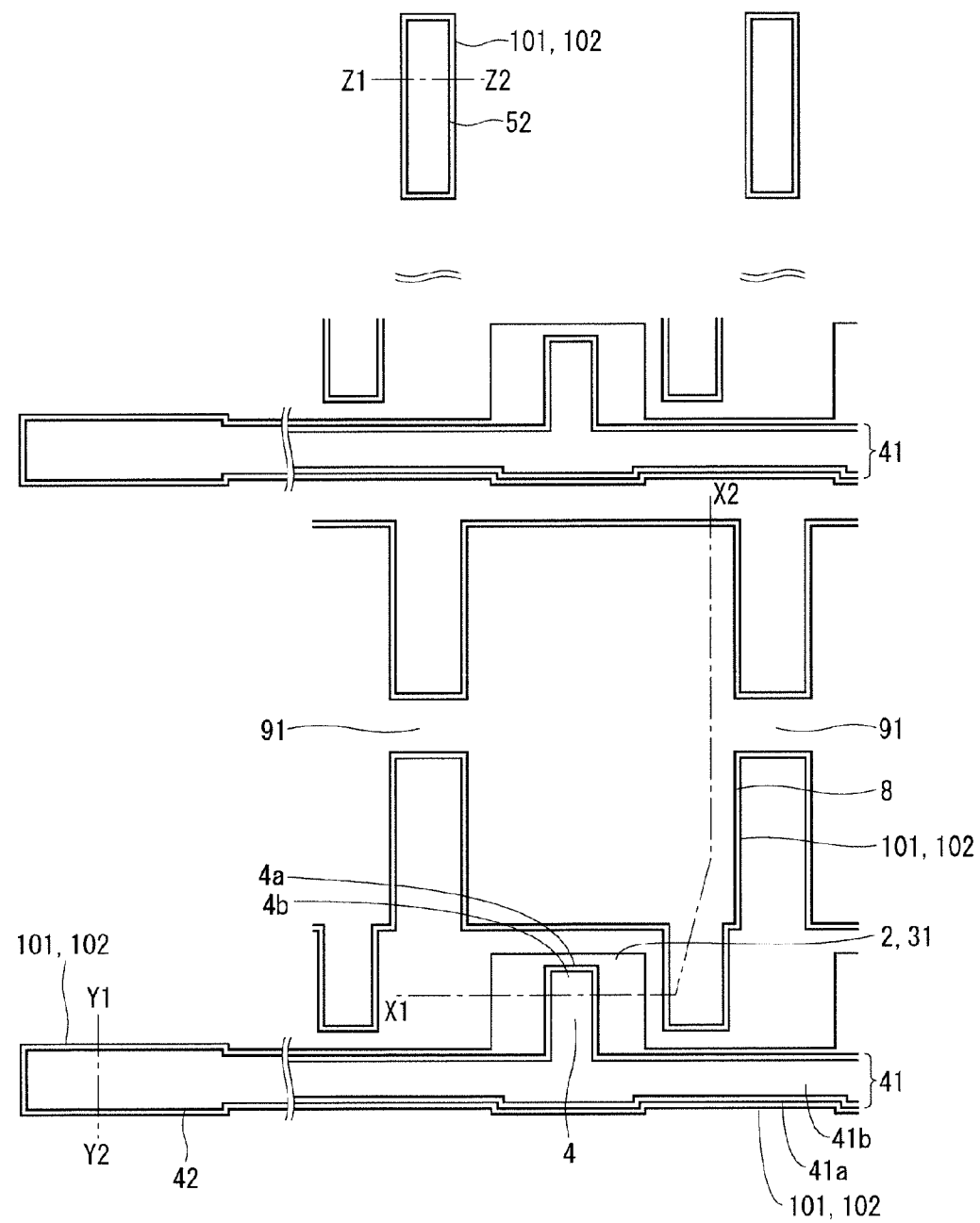
FIGS. 35 and 36 are process diagrams in plan view showing a method for manufacturing the TFT substrate according to the fourth preferred embodiment.
Figure 36:
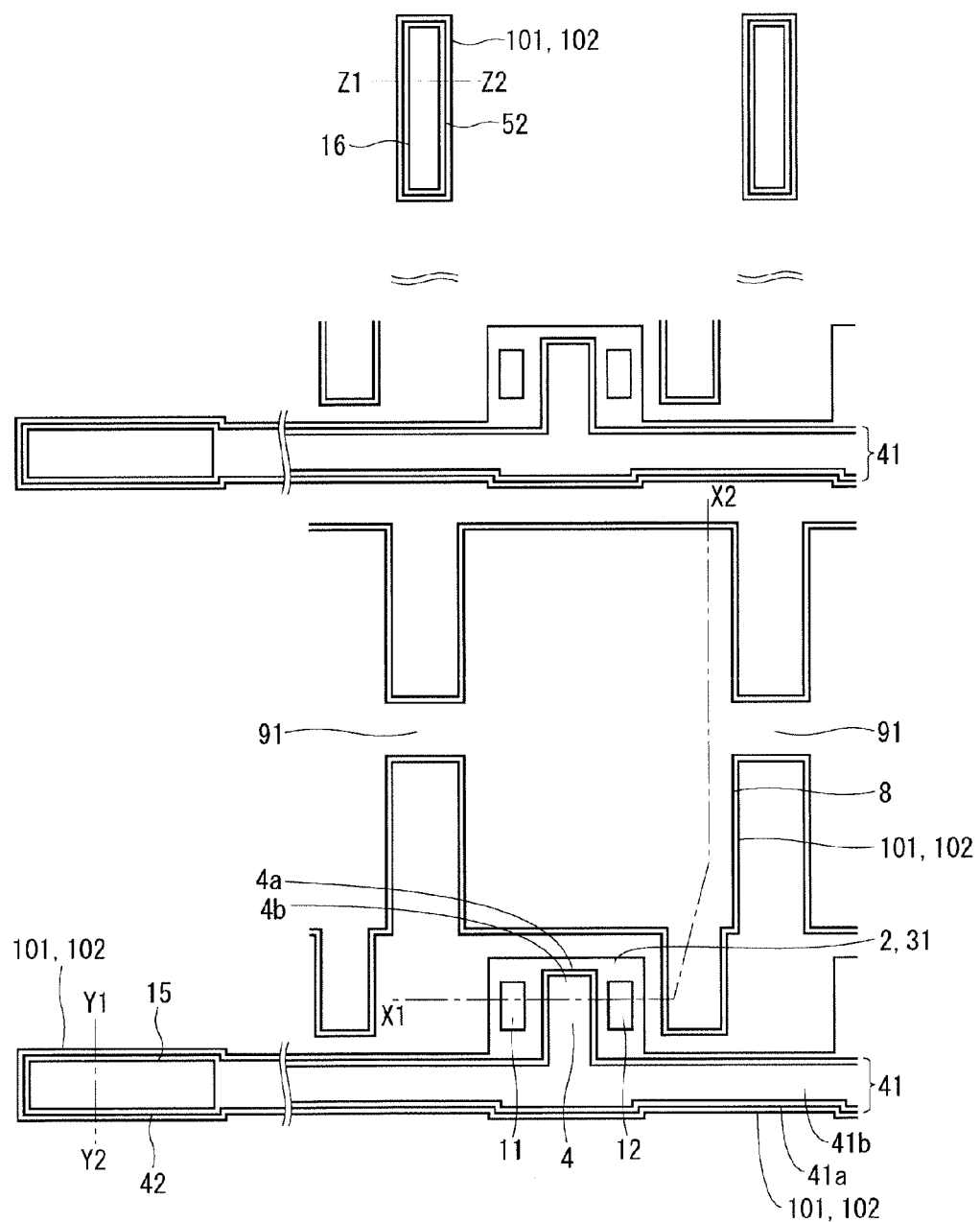
Figure 37:
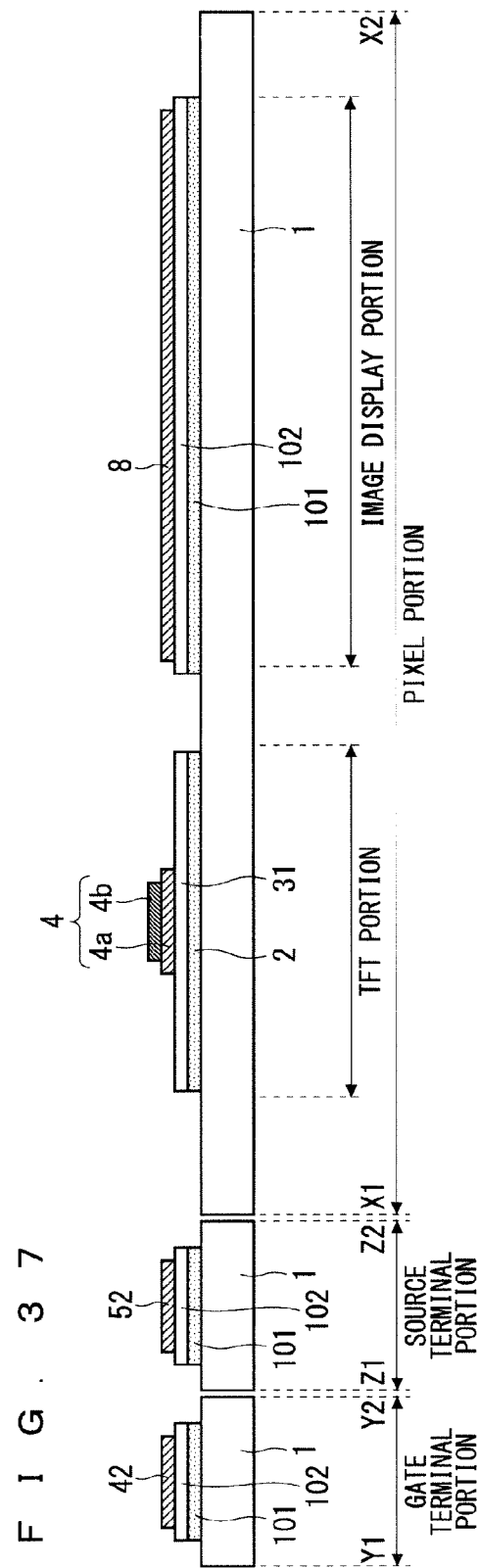
FIGS. 37 and 38 are process diagrams in cross section showing the method for manufacturing the TFT substrate according to the fourth preferred embodiment.
Figure 38:
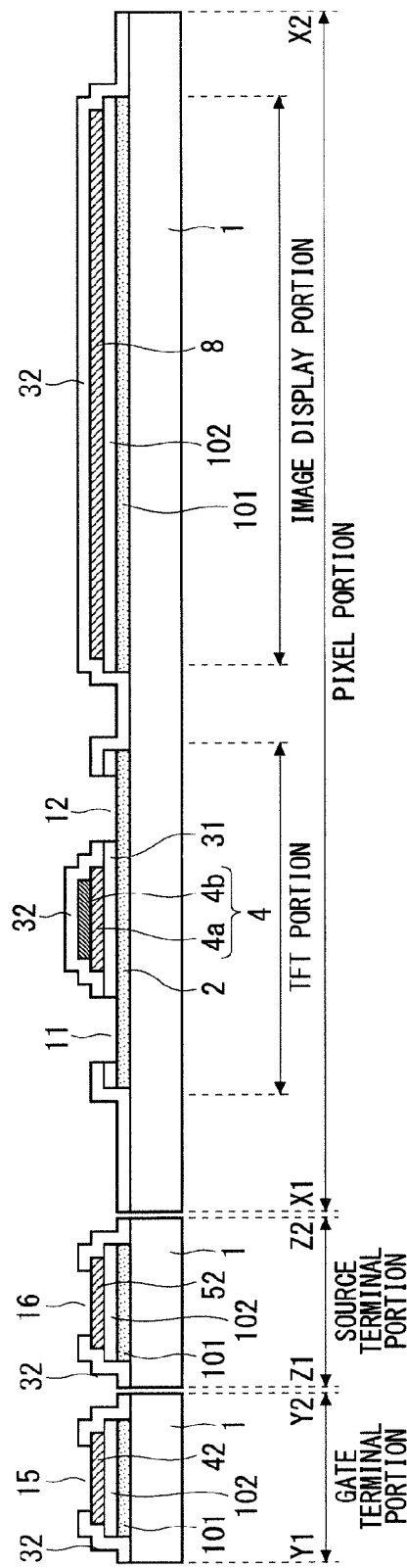

Next, a method for manufacturing the TFT substrate 200 according to the fourth preferred embodiment will be described with reference to FIGS. 35 to 38. FIGS. 35 and 36 are process diagrams in plan view showing each step of the method for manufacturing the TFT substrate 200, and FIGS. 37 and 38 are process diagrams in cross section showing each step of the method for manufacturing the TFT substrate 200. FIGS. 35 and 36 are plan views corresponding to FIGS. 37 and 38, respectively. In these diagrams, components corresponding to those shown in FIGS. 33 and 34 are denoted by the same references.

First, the surface of the substrate 1 is cleaned with cleaning liquid or pure water. A laminated film including the semiconductor film 101 being the material for the semiconductor channel film 2, the first insulating film 102 being the material for the gate insulating film 31, and the first conductive film 103 and the second conductive film 104 being the materials for the gate electrode 4 and the counter electrode 8 laminated in the stated order is formed on the substrate 1 that has been cleaned.

Also in this preferred embodiment similar to the first preferred embodiment, the InGaZnO film being the oxide semiconductor, the silicon oxide (SiO) film, the light-transmissive ITO film, and the Al-3 mol % Ni film being the aluminum (Al) alloy are used for the semiconductor film 101, the first insulating film 102, the first conductive film 103, and the second conductive film 104, respectively. In addition, their thicknesses and the method for forming them may be the same as those in the first preferred embodiment.

Subsequently, the same method described with reference to FIGS. 15 to 21 in the second preferred embodiment, namely, the first photolithography step using the half-tone exposure technique forms a photoresist pattern. Then, a method that repeats etching with the photoresist pattern as a mask and ashing (thickness reduction) of the photoresist pattern patterns the above-mentioned laminated film. It should be noted that the counter electrode 8 is formed instead of the pixel electrode 7 using the first conductive film 103, and the common wires 91 extending in parallel to the gate wires 41 are integrally formed with the counter electrode 8.

Thus, as shown in FIGS. 35 and 37, the semiconductor channel film 2, the gate insulating film 31, the gate electrode 4, the gate wires 41, the counter electrode 8, the common wires 91, the gate terminal 42, and the source terminal 52 are formed. The gate electrode 4 and the gate wires 41 have the laminated structure including the first conductive film 103 and the second conductive film 104, and the counter electrode 8, the common wires 91, the gate terminal 42, and the source terminal 52 have the single-layer structure including the first conductive film 103. The semiconductor film 101 and the semiconductor film 102 remain under the gate wires 41, the counter electrode 8, the common wires 91, the gate terminal 42, and the source terminal 52.

The following step is also almost the same as that of the second preferred embodiment. It should be noted that the pixel electrode 7 is formed instead of the counter electrode 8 using the third conductive film, and the pixel electrode 7 is needed to be integrally formed with the drain electrode 6. The contact hole 13 (pixel electrode contact hole) and the contact hole 14 (common electrode contact hole) are not formed.

In other words, the second insulating film is formed entirely on the substrate 1 so as to cover the semiconductor channel film 2, the gate insulating film 31, the gate electrode 4, the gate wires 41, the counter electrode 8, the common wires 91, the gate terminal 42, and the source terminal 52 after the formation thereof, to thereby form the interlayer insulating film 32. Then, the second photolithography step forms a photoresist pattern, and etching with the photoresist pattern as a mask forms the contact hole 11, the contact hole 12, the contact hole 15, and the contact hole 16 in the interlayer insulating film 32 and the gate insulating film 31, as shown in FIGS. 36 and 38.

Next, a laminated film including the third conductive film and the fourth conductive film laminated in the stated order is formed on the interlayer insulating film 32, the third photolithography step forms a photoresist pattern, and the third conductive film and the fourth conductive film are patterned by etching with the photoresist pattern as a mask, to thereby form the source electrode 5, the source wires 51, the drain electrode 6, the pixel electrode 7, the gate terminal pad 43, and the source terminal pad 53. The half-tone exposure technique is also applied in this step, and thus the fourth conductive film is removed from each region for forming the drain electrode 6, the pixel electrode 7, the gate terminal pad 43, and the source terminal pad 53 while the fourth conductive film remains in each region for forming the source electrode 5 and the source wires 51. In other words, the source electrode 5 and the source wires 51 have the laminated structure including the third conductive film and the fourth conductive film while the drain electrode 6, the pixel electrode 7, the gate terminal pad 43, and the source terminal pad 53 have the single-layer structure including the third conductive film.

As a result, the TFT substrate 200 having the configuration shown in FIGS. 33 and 34 is formed. In this manner, the TFT substrate 200 of the fourth preferred embodiment can be formed in the three photolithography steps with great productivity.

Upon assembly of the liquid crystal display panel, the TFT substrate 200 that has been completed includes the alignment film and the spacers formed on the surface thereof and includes the counter substrate that has been formed separately bonded thereon. The liquid crystals are injected into the gap in which the spacers create between the TFT substrate 200 and the counter substrate and are sealed, to thereby form the liquid crystal display panel. In the end, the polarizing plate, the phase difference plate, and the backlight unit are disposed on the outer side of the liquid crystal display panel, to thereby complete the LCD of the FFS mode.

The TFT substrate 200 according to the third preferred embodiment can obtain the effects similar to those of the first and second preferred embodiments. The counter electrode 8 is formed of the first conductive film and the counter electrodes 8 each in pixels are coupled to function as part of the common wires 91, which eliminates the need to individually provide the counter electrode 8 and the common wires 91. Thus, the counter electrode 8 is formed in almost the entire region of the pixel portion, whereby the area of the image display portion can be increased. Consequently, the LCD of the FFS mode that is brighter and has a high display quality can be realized. This enables a display at high luminance even with the reduced emitting light from the backlight unit, which can also contribute to a reduction in power consumption.

Modification of Fourth Preferred Embodiment

Figure 39:
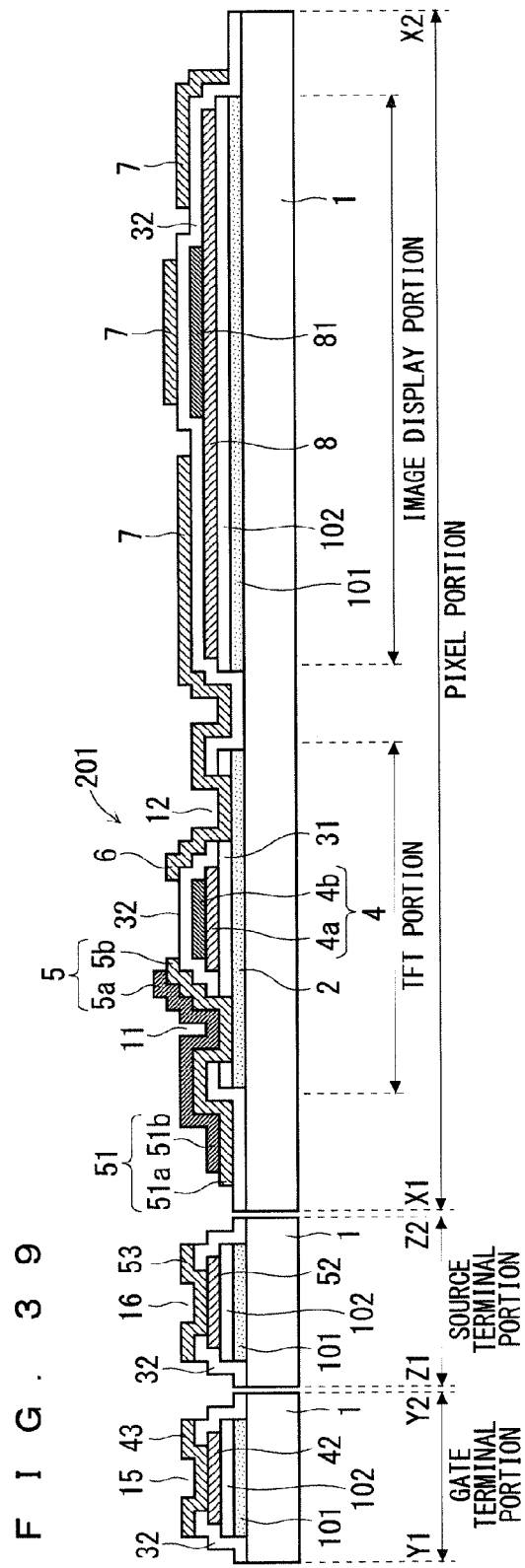
FIG. 39 is a cross-sectional view showing a TFT substrate according to a modification of the fourth preferred embodiment.

FIG. 39 is a cross-sectional view showing a TFT substrate 200 according to a modification of the fourth preferred embodiment. As shown in FIG. 39, the TFT substrate 200 of the fourth preferred embodiment includes a reflective counter electrode 81 that reflects light provided in a fixed area on the counter electrode 8, whereby the semi-transmissive TFT substrate 200 can also be manufactured.

The reflective counter electrode 81 is formed of the second conductive film 104 (metal film such as the Al-3 mol % Ni film), so that a manufacturing step is not increased. In other words, in the half-tone exposure of the first photolithography step, the light-shielding region T3 may be provided on a portion corresponding to the region for forming the reflective counter electrode 81. Consequently, the thick third photoresist portion 113 is formed in the region, whereby the first conductive film 103 serving as the reflective counter electrode 81 can remain on the corresponding portion of the counter electrode 8.

Changing the area or the shape of the pattern of the reflective counter electrode 81 formed on the counter electrode 8 can arbitrarily set the ratio of the transmitted light and the reflected light of the semi-transmissive electrode. Moreover, if the reflective counter electrode 81 is formed on almost the entire surface of the counter electrode 8, the full reflective TFT substrate 200 can be manufactured.

The reflective counter electrode 81 also functions as part of the common wires 91, so that a Al alloy film or a Ag (silver) alloy film having a high light-reflectance (greater than or equal to 70% in a visible light region of 400 nm to 800 nm) and a low electrical resistance (resistivity is less than or equal to 10 μΩm) is preferably used for the second conductive film forming the reflective counter electrode 81.

Figure 40:
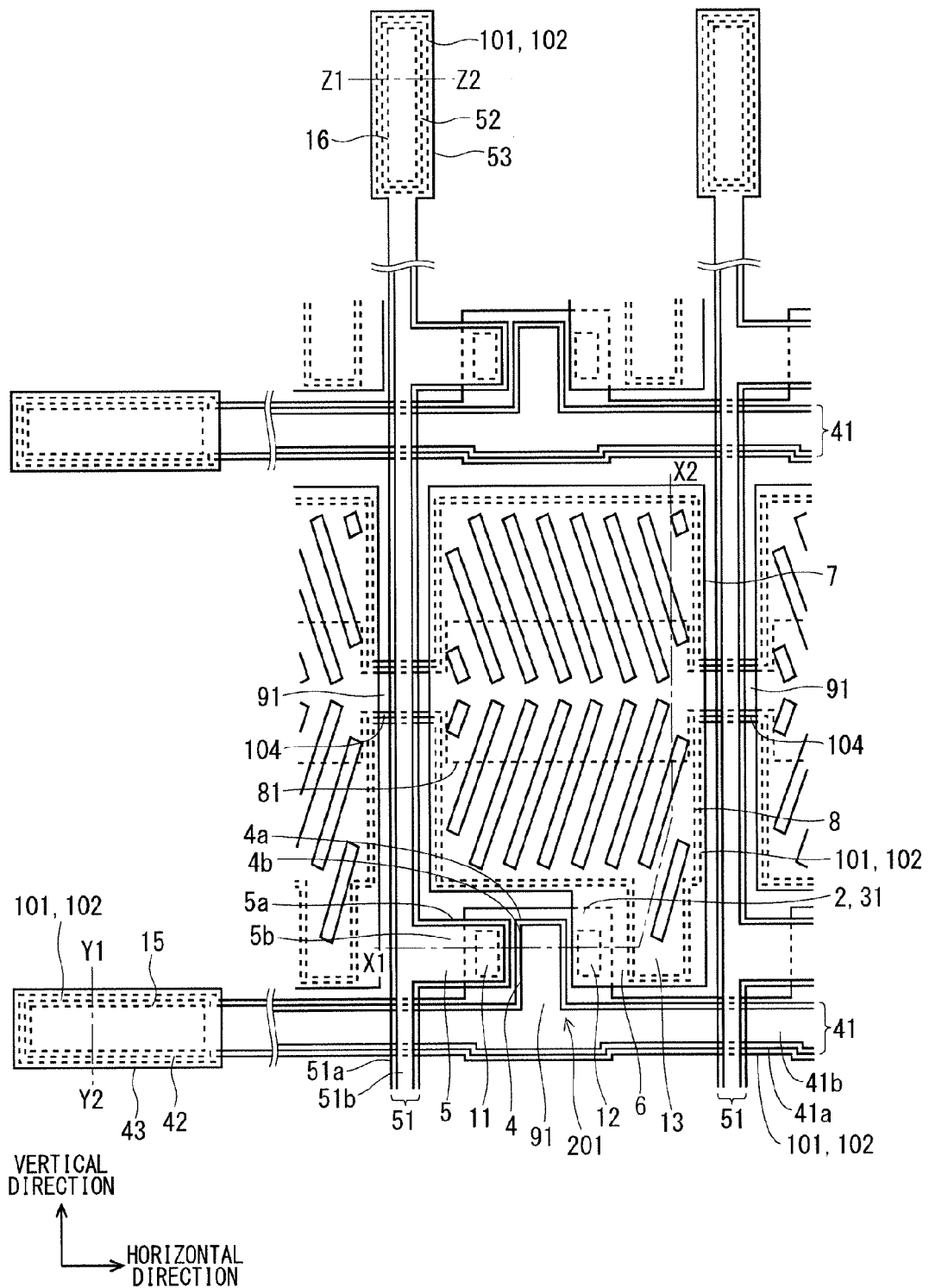
FIG. 40 is a plan view showing the TFT substrate according to the modification of the fourth preferred embodiment.

As shown in FIG. 40, the second conductive film 104 remains on the common wires 91, and thus the common wires 91 have the laminated structure including the first conductive film 103 and the second conductive film 104. Furthermore, the second conductive film 104 on the common wires 91 is also integrally formed with the reflective counter electrode 81 such that the reflective counter electrodes 81 are configured to be coupled in the horizontal direction (extending direction of the gate wires 41). Consequently, the common wires 91 can have a lower resistance and can be suitably applicable to a large panel.

This method can also be applicable to the common wires 91 of the third preferred embodiment (FIGS. 26 and 27). In other words, if the fourth conductive film is located on the common wires 91 of the third preferred embodiment and the common wires 91 have the laminated structure including the third conductive film and the fourth conductive film, the common wires 91 can have a low resistance. This configuration can be realized if the thick portion of the photoresist pattern is formed in the region for forming the common wires 91 upon the formation of the photoresist pattern on the laminated film including the third conductive film and the fourth conductive film by the half-tone exposure.

Other Modifications

In the modifications of the first to fourth preferred embodiments above, the Al-3 mol % Ni film is used for the second and fourth conductive films, but this is not restrictive. For example, Cr, Ti, Mo, Ta, and Cu that are well-known general metal films and these alloys can be widely used. In the present invention, in a case where these metal films are processed by etching, the surface of the channel layer of the TFT is covered with the first insulating film for protection. Thus, even in a case where these metal films are processed by etching with the acid chemical solution, the acid chemical solution does not expose the channel layer unlike the conventional manner. Therefore, even in a case where the oxide semiconductor film having a poor resistance to the acid chemical solution is used for the channel layer of the TFT, the etching does not destroy the channel layer. Therefore, the high-performance TFT substrate 200 including the oxide semiconductor film for the channel layer can be easily realized.

Moreover, the oxide semiconductor formed of the InGaZnO system is used for the semiconductor channel film 2, but this is not restrictive. For example, the other oxide semiconductor films, such as InZnO system, InGaO system, InSnO system, InSnZnO system, InGaZnSnO system, InAlZnO system, InHf (hafnium) ZnO system, InZr (zirconium) ZnO system, InMg (magnesium) ZnO system, InY (yttrium) ZnO system, and ZnSnO system, can be used. In a case where these oxide semiconductor materials are used, effects similar to those of the oxide semiconductor film of the InGaZnO system in the preferred embodiments can be obtained.

Furthermore, a planarizing film made of resin may be applied as the second conductive film forming the interlayer insulating film 32. For example, FIG. 41 is a cross-sectional view showing a modification in which the planarizing film is applied to the interlayer insulating film 32 in the TFT substrate 200 of the fourth preferred embodiment. The upper surface of the interlayer insulating film 32 is a nearly flat surface without a step, which can prevent the source electrode 5, the drain electrode 6, and the counter electrode 8 (pixel electrode 7 in the first to third preferred embodiments) formed on the interlayer insulating film 32 from breaking a wire in the step portion and can improve manufacturing yields. The alignment surface having the liquid crystals of the TFT-LCD that are arranged by the electric field (lateral electric field) in a horizontal direction to the TFT substrate 200 can be aligned, so that there is also an advantage that the display characteristics having the high quality of the contrast can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An active matrix substrate, comprising:
a substrate;
a thin film transistor formed on said substrate;
a gate wire connected to a gate electrode of said thin film transistor;
a source wire connected to a source electrode of said thin film transistor;
a pixel electrode connected to a drain electrode of said thin film transistor;
a counter electrode disposed opposite to said pixel electrode; and
a common wire supplying said counter electrode with a specified voltage, wherein
said thin film transistor includes:
a semiconductor channel film that is formed on said substrate and is formed of a semiconductor film;
a gate insulating film that is formed on said semiconductor channel film and is formed of a first insulating film;
said gate electrode that is formed of a laminated film including a first conductive film and a second conductive film on said first conductive film formed on said gate insulating film;
an interlayer insulating film that is formed on said semiconductor channel film, said gate insulating film, and said gate electrode and is formed of a second insulating film;
said source electrode that is formed of a laminated film including a third conductive film and a fourth conductive film on said third conductive film formed on said interlayer insulating film and is connected to said semiconductor channel film through a contact hole formed in said interlayer insulating film and said gate insulating film; and
said drain electrode that is formed of said third conductive film and is connected to said semiconductor channel film through a contact hole formed in said interlayer insulating film and said gate insulating film,
said gate wire is formed of the laminated film including said first conductive film and said second conductive film and is formed to be connected to said gate electrode,
said source wire is formed of the laminated film including said third conductive film and said fourth conductive film and is formed to be connected to said source electrode,
said pixel electrode is formed of said first conductive film and is connected to said drain electrode through a contact hole formed in said interlayer insulating film, and
said counter electrode is formed of said third conductive film and formed on said pixel electrode via said interlayer insulating film.

2. The active matrix substrate according to claim 1, wherein said common wire is formed of the laminated film including said first conductive film and said second conductive film and is connected to said counter electrode through a contact hole formed in said interlayer insulating film.

3. The active matrix substrate according to claim 1, wherein said semiconductor film and said first insulating film exist under said gate wire and said pixel electrode.

4. The active matrix substrate according to claim 3, wherein
said common wire is formed of the laminated film including said first conductive film and said second conductive film and is connected to said counter electrode through a contact hole formed in said interlayer insulating film, and
said semiconductor film and said first insulating film exist under said common wire.

5. The active matrix substrate according to claim 3, wherein said common wire is formed of said third conductive film and integrally formed with said counter electrode.

6. The active matrix substrate according to claim 3, wherein said semiconductor film is formed of a light-transmissive oxide semiconductor and has a thickness of greater than or equal to 20 nm and less than or equal to 150 nm.

7. The active matrix substrate according to claim 1, further comprising:
a gate terminal that is provided at an end portion of said gate wire and is formed of said first conductive film;
a gate terminal pad that is formed of said third conductive film and is connected to said gate terminal through a contact hole formed in said interlayer insulating film;
a source terminal that is provided at an end portion of said source wire and formed of said first conductive film; and
a source terminal pad that is formed of said third conductive film and is connected to said source terminal through a contact hole formed in said interlayer insulating film.

8. The active matrix substrate according to claim 1, wherein
said semiconductor film is formed of a light-transmissive oxide semiconductor, and
said first conductive film is formed of a light-transmissive conductive film.

9. The active matrix substrate according to claim 1, wherein said counter electrode has a grid pattern or a comb pattern having slits.

10. The active matrix substrate according to claim 1, wherein
said second conductive film is formed of a metal film that reflects light, and
a reflective pixel electrode formed of said second conductive film is formed on at least part of said pixel electrode.

11. An active matrix substrate, comprising:
a substrate;
a thin film transistor formed on said substrate;
a gate wire connected to a gate electrode of said thin film transistor;
a source wire connected to a source electrode of said thin film transistor;
a pixel electrode connected to a drain electrode of said thin film transistor;
a counter electrode disposed opposite to said pixel electrode; and
a common wire supplying said counter electrode with a specified voltage, wherein
said thin film transistor includes:
a semiconductor channel film that is formed on said substrate and is formed of a semiconductor film;
a gate insulating film that is formed on said semiconductor channel film and is formed of a first insulating film;
said gate electrode that is formed of a laminated film including a first conductive film and a second conductive film on said first conductive film formed on said gate insulating film;
an interlayer insulating film that is formed on said semiconductor channel film, said gate insulating film, and said gate electrode and is formed of a second insulating film;
said source electrode that is formed of a laminated film including a third conductive film and a fourth conductive film on said third conductive film formed on said interlayer insulating film and is connected to said semiconductor channel film through a contact hole formed in said interlayer insulating film and said gate insulating film; and
said drain electrode that is formed of said third conductive film and is connected to said semiconductor channel film through a contact hole formed in said interlayer insulating film and said gate insulating film,
said gate wire is formed of the laminated film including said first conductive film and said second conductive film and is formed to be connected to said gate electrode,
said source wire is formed of the laminated film including said third conductive film and said fourth conductive film and is formed to be connected to said source electrode,
said pixel electrode is formed of said third conductive film and formed to be connected to said drain electrode,
said counter electrode is formed of said first conductive film and formed under said pixel electrode via said interlayer insulating film, and
said common wire is formed of said first conductive film and integrally formed with said counter electrode.

12. The active matrix substrate according to claim 11, wherein said semiconductor film and said first insulating film exist under said gate wire, said counter electrode, and said common wire.

13. The active matrix substrate according to claim 12, wherein said semiconductor film is formed of a light-transmissive oxide semiconductor and has a thickness of greater than or equal to 20 nm and less than or equal to 150 nm.

14. The active matrix substrate according to claim 11, further comprising:
a gate terminal that is provided at an end portion of said gate wire and is formed of said first conductive film;
a gate terminal pad that is formed of said third conductive film and is connected to said gate terminal through a contact hole formed in said interlayer insulating film;
a source terminal that is provided at an end portion of said source wire and is formed of said first conductive film; and
a source terminal pad that is formed of said third conductive film and is connected to said source terminal through a contact hole formed in said interlayer insulating film.

15. The active matrix substrate according to claim 11, wherein
said semiconductor film is formed of a light-transmissive oxide semiconductor, and
said first conductive film is formed of a light-transmissive conductive film.

16. The active matrix substrate according to claim 11, wherein said counter electrode has a grid pattern or a comb pattern having slits.

17. The active matrix substrate according to claim 11, wherein
   said second conductive film is formed of a metal film that reflects light, and
   a reflective common electrode formed of said second conductive film is formed on at least part of said counter electrode.

* * * * *